United States Patent [19]
Hirschtick et al.

[11] Patent Number: 5,815,154
[45] Date of Patent: Sep. 29, 1998

[54] GRAPHICAL BROWSER SYSTEM FOR DISPLAYING AND MANIPULATING A COMPUTER MODEL

[75] Inventors: Jon K. Hirschtick, Winchester; Stephen G. Krug, Chestnut Hill; Robert P. Zuffante, Newton, all of Mass.

[73] Assignee: SolidWorks Corporation, Concord, Mass.

[21] Appl. No.: 574,629

[22] Filed: Dec. 20, 1995

[51] Int. Cl.⁶ ............................... G06F 3/14; G06T 17/40
[52] U.S. Cl. .................... 345/356; 345/420; 345/964; 345/346; 345/348
[58] Field of Search ................... 395/342, 339, 395/348, 349, 356, 357, 967, 133, 140, 141, 118, 119, 120; 345/342, 339, 348, 349, 356, 357, 967, 433, 440, 441, 418, 419, 420, 346, 964

[56] References Cited

U.S. PATENT DOCUMENTS

| | | | |
|---|---|---|---|
| 5,006,991 | 4/1991 | Ohcoshi et al. | 364/474.2 |
| 5,437,007 | 7/1995 | Bailey et al. | 395/349 |
| 5,490,246 | 2/1996 | Brotsky et al. | 395/342 |
| 5,504,917 | 4/1996 | Austin | 395/800 |
| 5,590,271 | 12/1996 | Klinker | 395/326 |
| 5,689,711 | 11/1997 | Bardasz et al. | 395/701 |

FOREIGN PATENT DOCUMENTS

| | | |
|---|---|---|
| 0 528 631 A2 | 2/1993 | European Pat. Off. . |
| 0 074 811 A2 | 4/1996 | European Pat. Off. . |

OTHER PUBLICATIONS

Mortenson, Michael E., "Geometric Modeling", 1985, John Wiley & Sons, Inc., New York, pp. 431–485.

Internet document downloaded on Mar. 27, 1996 and accessible on the Internet at http://www.intergraph.com/press95/solidedg.htm and titled "Intergraph's Solid Edge™ Software Leads CAD Revolution".

Internet document downloaded on Mar. 27, 1996 and accessible on the Internet at http://www.eye.com/press2.html and titled "3D/EYE TriSpectives Delivers the First Complete Solution for Desktop 3D".

*Using Windows™ NT*, copyrightd in 1993 by Que® Corporation of Indianapolis, IN, Chapter 5, "Managing Files with the File Manager", pp. 125–191.

Foley, et al. "Computer Graphics, Principles and Practice", 1990 Addison–Wesley, pp. 557–561.

"Space Division for Ray Tracing in CSG", IEEE Computer Graphics and Applications, vol. 6., No. 4, Apr. 1986, pp. 28–34.

*Primary Examiner*—Raymond J. Bayerl
*Attorney, Agent, or Firm*—Foley, Hoag & Eliot, LLP

[57] ABSTRACT

A graphical browser displays and manipulates a computer model by accessing data indicative of features and geometric characteristics of the model, presents graphical data indicative of features of the model, and allows a user to graphically manipulate features to provide corresponding changes to the model. The data may be accessed by interfacing to feature data and geometric data of the model. Different icons, indicative of different types of features of the model, may be displayed. The icons may be ordered and connected to indicate an order of creation of features of the model and/or presented in a way to indicate interdependency of features.

43 Claims, 27 Drawing Sheets

GRAPHICAL BROWSER SYSTEM FOR DISPLAYING AND MANIPULATING A COMPUTER MODEL

TECHNICAL FIELD

This application relates to the field of computer-aided design and more particularly to the field of accessing and manipulating data describing a model constructed using computer-aided design.

BACKGROUND OF THE INVENTION

Computer-aided design software can be used to construct and manipulate computer drawings of objects referred to as "models". The user is presented with a display of the model on the computer screen and manipulates the model using keyboard commands, a mouse/cursor combination, and other various input means. Changes to the model are reflected in the screen display of the model as the user makes the changes or, alternatively, in response to the user issuing a specific command to update the screen display of the model. In either case, the screen display of the model serves as the main source of model information to the user and as the user's reference for inputting and changing features of the model.

As modeling software becomes more powerful, it also becomes more complex. This increase in complexity increases the difficulty of use of the modeling software. If the software becomes too complex, then the user will have a difficult time making modifications and/or determining critical information about the model, especially since the screen display of the model is the user's main source of information and point of reference for facilitating input. This problem becomes more acute when the model is a three-dimensional model since, depending on the modeling software and the nature of the model, it is sometimes difficult, if not impossible, to see the entirety of the model at any one time.

One way to address the increasing complexity of modeling software is to provide alternatives to the traditional techniques for presenting the model information to the user that allow the user to manipulate the model information. U.S. Pat. No. 5,006,991 to Ohcoshi et al. discloses a system for graphically checking interference between stationary and moving objects. A design layout is graphically displayed and an object or a person is moved through the design layout by the graphical display device. Column 9, lines 64–66 indicate that along with displaying the design layout, the system can display a chart showing connections and positions of objects in the design layout.

Although the Ohcoshi et al. patent addresses a specific problem associated with modeling in the specific situation discussed in the patent, it does not address the general problem of modeling software complexity and unwieldiness and it does not provide a general alternative technique for accessing and manipulating models. Accordingly, it is desirable to provide an alternative and effective technique for presenting and manipulating model data that allows the user to easily make changes to a model and that presents model information to the user that is useful although not apparent from simply viewing the model on the screen display.

SUMMARY OF THE INVENTION

According to the present invention, a graphical browser displays and manipulates a computer model by accessing data indicative of features and geometric characteristics of the model, presents graphical data indicative of features of the model, and allows a user to graphically manipulate features to provide corresponding changes to the model. The data may be accessed by interfacing to feature data and geometric data of the model. Different icons, indicative of different types of features of the model, may be displayed. The icons may be ordered and connected to indicate an order of creation of features of the model. The icons may be presented in a way to indicate interdependency of features.

Graphically manipulating the features may include altering the ordering of the features of the model, selectively suppressing certain ones of the features, or rolling back the model to a particular feature, so that that particular feature and subsequent features are suppressed. Graphically manipulating the features may also include stepping through each feature of the model, one at a time, to unsuppress each feature on the model, one at a time. Presenting graphical data may also include presenting various alignment features of the model.

According further to the present invention, a computer-aided design system for displaying and manipulating a computer model presents the computer model in a modeling portion of a computer screen, presents graphical data indicative of features of the model in a graphical browser portion of the computer screen, highlights a subset of the modeling portion in response to a user selecting a corresponding subset of the graphical browser portion, and highlights a subset of the graphical browser portion in response to the user selecting a corresponding subset of the modeling portion.

The graphical browser provides the user with a powerful technique for creating and editing models. In the case of three dimensional models, the graphical browser provides the user with simultaneous access to all of the features of the model even if all of the model features cannot be seen all at the same time in a screen display of the model. The data manipulation features of the graphical browser allow the user to easily enter and edit model data in ways that would be difficult or cumbersome if the user were forced to use only the screen display of the model as an input reference.

DETAILED DESCRIPTION OF THE PREFERRED EMBODIMENTS

Figure 1:
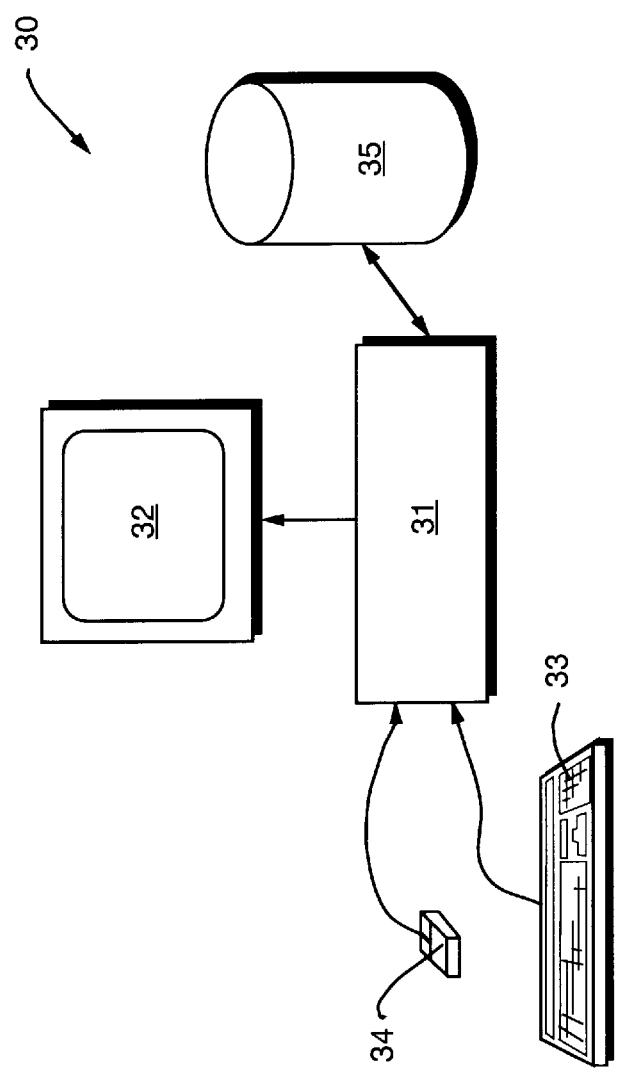
FIG. 1 is a schematic diagram of a computerized modeling system used to provide computer-aided design and to provide the graphical browser according to the present invention.

Referring to FIG. 1, a computerized modeling system 30 includes a CPU 31, a CRT 32, a keyboard input device 33, a mouse input device 34, and a storage device 35. The CPU 31, CRT 32, keyboard 33, mouse 34, and storage device 35 are conventional, commonly available, computer hardware devices such as those provided with the Alpha XP150 computer system manufactured by Digital Equipment Corporation of Maynard, Mass. The mouse 34 has conventional, user-actuatable, left and right buttons. Other appropriate computer hardware platforms are suitable as will become apparent from the discussion which follows.

Computer-aided design software is stored on the storage device 35 and is loaded into and executed by the CPU 31. The software allows the user to create and modify a three-dimensional model. The CPU 31 uses the CRT 32 to display a three-dimensional model and other aspects thereof as described in more detail below. A user actuates the keyboard 33 and the mouse 34 to enter and modify data for the three-dimensional model. The CPU 31 accepts and processes input from the keyboard 33 and the mouse 34. Using the three-dimensional modeling software, the CPU 31 processes the input along with the data associated with the three-dimensional model and makes corresponding and appropriate changes to the display on the CRT 32. In addition, data corresponding to the three-dimensional model created by the user can be written from the CPU 31 to the storage device 35. Although the remainder of the discussion relates to use of the invention with computer-aided design software for providing three-dimensional models, it will be appreciated by those of ordinary skill in the art that the invention could also be used in conjunction with any computer-aided design software, including software used to generate two-dimensional models.

Figure 2:
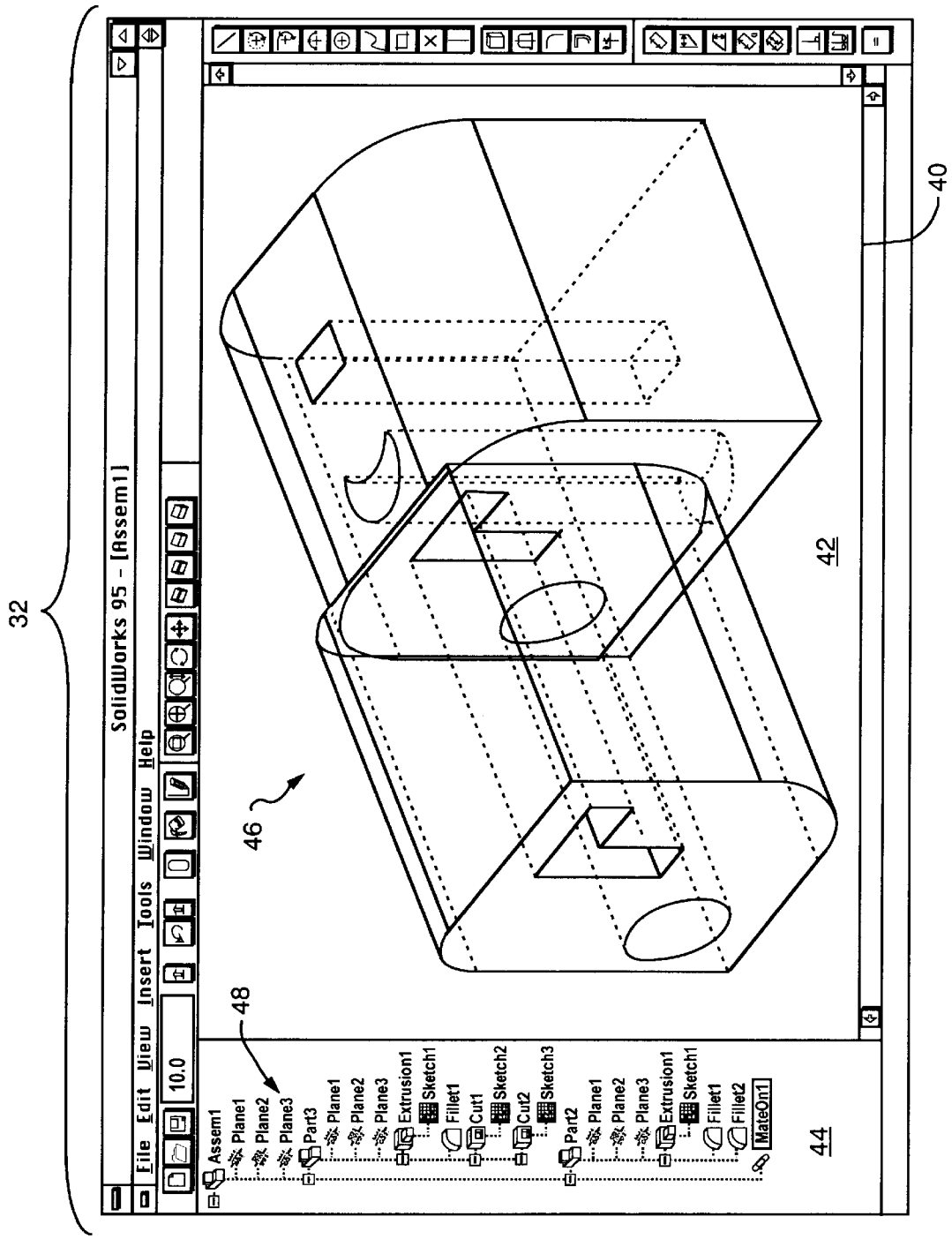
FIG. 2 illustrates a CRT display of the system of FIG. 1 showing a modeling portion and a browser portion of a CRT display window.

Referring to FIG. 2, a display on the CRT 32 is shown in detail and includes a window 40. The window 40 is a conventional screen display window which can be programmed by one of ordinary skill in the art using conventional, commercially available, software programming tools, such as those available from Microsoft Corporation of Redmond, Wash.

The window 40 includes two portions, a modeling portion 42 and a graphical browser portion 44. The modeling portion 42 contains a three-dimensional model 46 that can be constructed and modified by the user in a conventional manner. The three-dimensional model 46 can be displayed in a conventional manner using solid lines and dashed lines to show visible edges and hidden edges, respectively, of the three-dimensional model. The graphical browser portion 44 aids visualization and manipulation of the model portion 42. As described in more detail below, the graphical browser portion 44 can be used to visualize and/or edit feature types, names, model structure, relationships between features, order, dates of creation and modification of features, feature suppression, feature visibility and other similar attributes of the model 46.

The graphical browser portion 44 shows a list of features 48 containing aspects or components of the three-dimensional model 46. The features 48 are represented in a way that illustrates that certain ones of the features 48 are in fact comprised of lower-level features. For example, the feature labeled "Part3" on FIG. 2 is comprised of the features labeled "Plane1", "Plane2", "Plane3", "Extrusion1", "Fillet1", "Cut1", and "Cut2". In addition, the feature labeled "Extrusion1" is further comprised of a subfeature labeled "Sketch1" and the subfeatures labeled "Cut1" and "Cut2" are further comprised of subfeatures labeled "Sketch1" and "Sketch2", respectively. The features of the feature list 48 are ordered from top to bottom to show the order of entry by the user.

Figure 3:
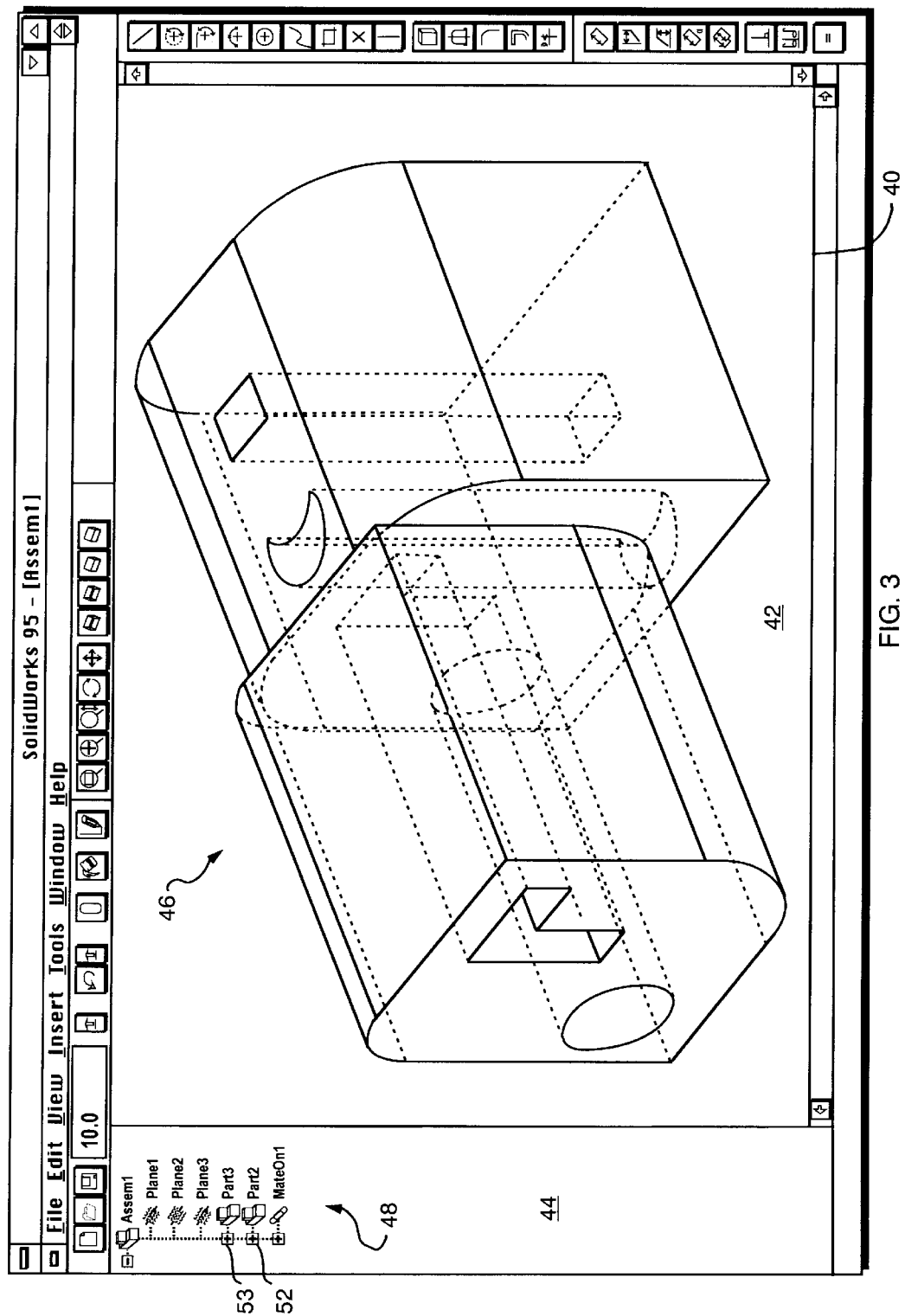
FIG. 3 illustrates the window of FIG. 2 with hidden subfeatures of the features screen in the browser portion.

Referring to FIG. 3, the window 40 shows the features list 48 with the subfeatures thereof hidden. In that case, note that the feature labeled "Part2" is connected with a horizontal line to a box 52 having a plus sign therein and the feature labeled "Part3" is connected with a horizontal line to a box 53 having a plus sign therein. The plus signs in the boxes 52,53 indicate that particular features attached thereto via a horizontal line are actually comprised of one or more subfeatures that are not shown in the feature list 48. The user can modify the feature list 48 of FIG. 3 to provide the detailed feature list 48 as shown in FIG. 2 by using the mouse 34 to click on the boxes 52, 53. Once the features have been expanded to the subfeatures thereof, the boxes 52,53 contain a minus sign indicating that the features have been expanded, as shown in FIG. 2.

Figure 4A:
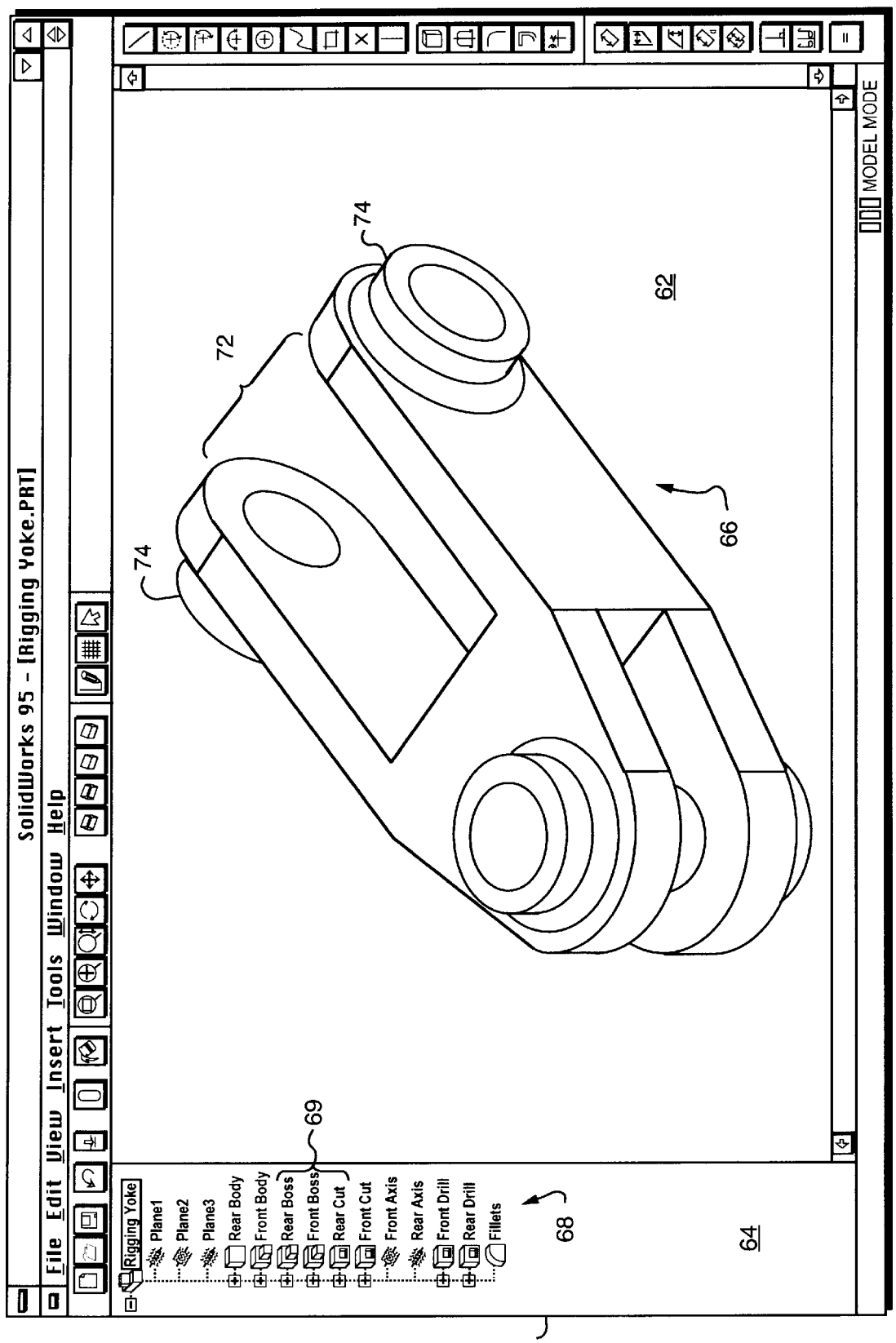
FIG. 4A is a window showing a first model portion and a first browser portion.
Figure 4B:
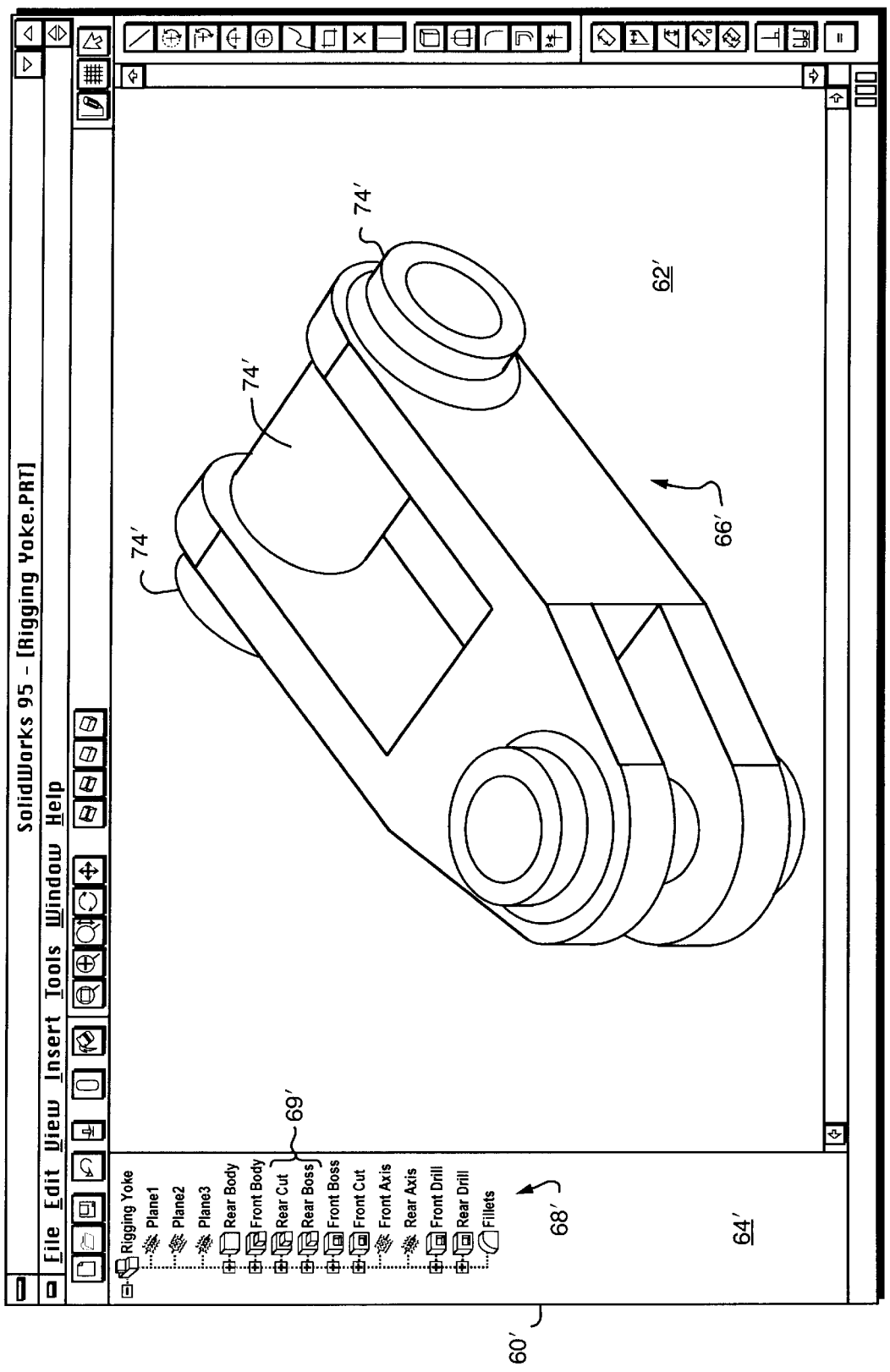
FIG. 4B is a window showing a second model portion and a second browser portion.

FIG. 4A and FIG. 4B illustrate the effects of changing the order of features in a feature list. FIG. 4A shows a window 60 having two portions, a modeling portion 62 and a graphical browser portion 64. The modeling portion 62 contains a three-dimensional model 66 that is constructed and modified by the user. The graphical browser portion 64 includes a feature list 68 showing aspects and components of the model 66. Similarly, FIG. 4B shows a window 60' having a modeling portion 62' and a graphical browser portion 64' wherein the model portion 62' includes a three-dimensional model 66' and the graphical browser portion 64' includes a feature list 68' showing aspects and components of the model 66'.

A portion 69 of the feature list 68 shows two features labeled "Rear Boss" and "Rear Cut". In the feature list 68 of FIG. 4A, the Rear Boss feature precedes (i.e., is higher than) the Rear Cut feature. Accordingly, a rear portion 72 of the model 66 shows a rear boss 74 that has been cut in the middle thereof by the Rear Cut feature. Therefore, the rear boss 74 of the model 66 is in two separate parts, one on each lateral side of the model 66.

The feature list 68' also has a section 69' containing features labeled "Rear Cut" and "Rear Boss". However, in the case of the feature list 68' of FIG. 4B, the section 69' shows that the Rear Cut feature precedes (i.e., is higher than) the Rear Boss feature. Accordingly, a rear portion 72' of the model 66' shows a rear boss 74' that has not been cut, but instead, extends continuously from one lateral side of the model 66' to the other lateral side of the model 66'. This occurs because the order of features shown in the section 69' indicates that the rear cut is performed prior to adding the boss 74' to the model 66'. Therefore, the rear cut, which comes before the addition of the rear boss 74', has no effect on the rear boss 74' in the model 66'.

The section 69 of the feature list 68 in FIG. 4A is modified to provide the section 69' of the feature list 68' of FIG. 4B using a technique called "drag and drop". Drag and drop is a conventional technique that involves using the mouse 34 to move an icon associated with a feature to a different location in the feature list. The user places the mouse cursor over the icon of the feature to be moved, clicks and holds down the left button of the mouse 34 while moving the mouse cursor and the feature icon to the desired location, and then releases the button of the mouse 34. Alternatively, the user can achieve the same results by employing a similar conventional technique, called "cut and paste", to highlight one or more icons, execute a "cut" or "copy"operation, select an insertion location, and execute a "paste" operation. Implementation of the drag and drop option and the cut and paste option is described in more detail hereinafter.

Note that the section 69 of the feature list 68 in FIG. 4A can be modified in one of two ways to provide the section 69' of the feature list 68' in FIG. 4B. The user can use the mouse 34 to drag and drop (or cut and paste) the Rear Cut feature so that it precedes the Rear Boss feature as shown in the section 69'. Alternatively, the user can use the mouse 34 to drag and drop (or cut and paste) the Rear Boss feature so that it comes after the Rear Cut feature as shown in the section 69'.

Figure 5:
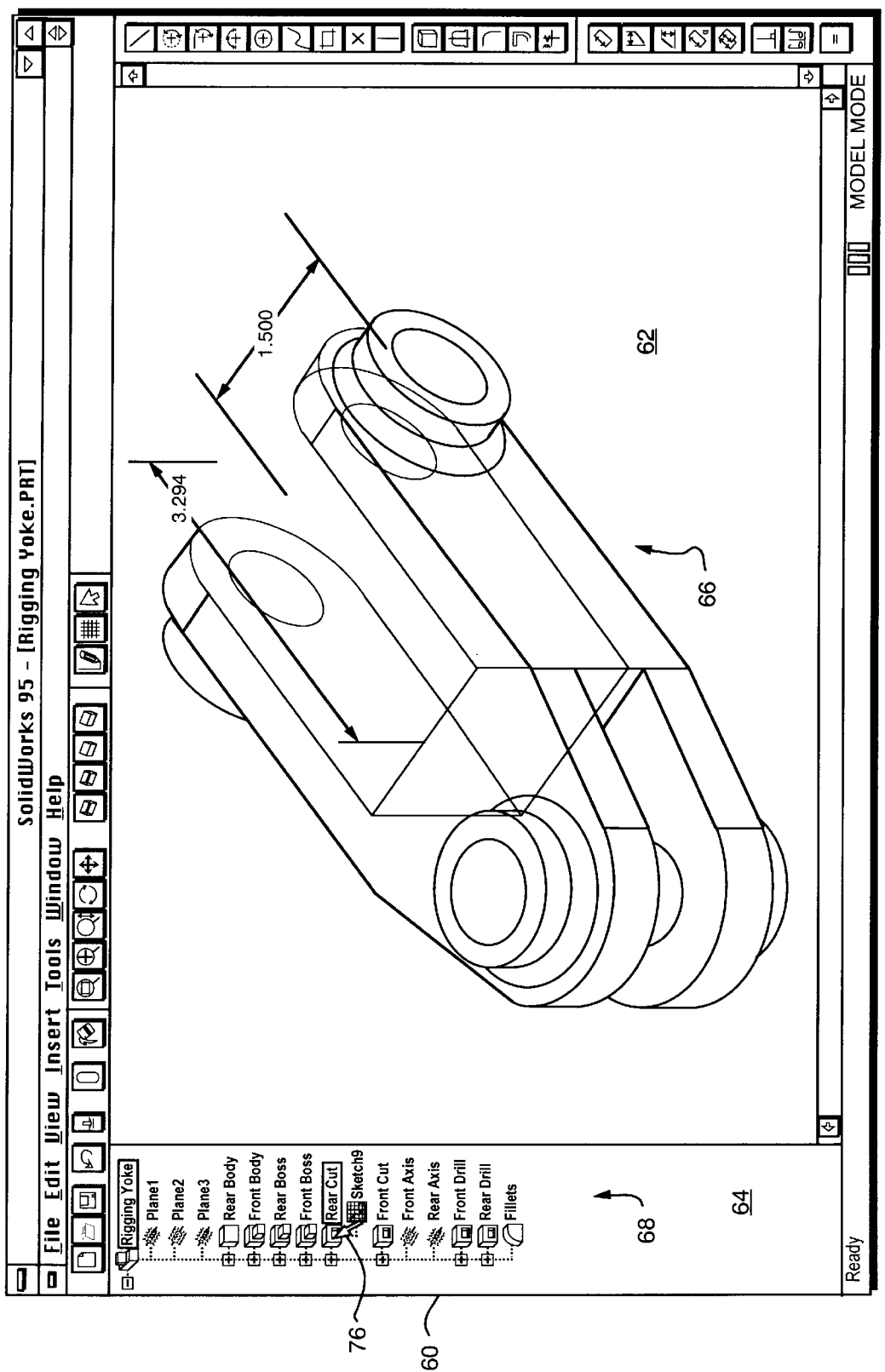
FIG. 5 is a window showing a model portion and a model portion with a model having dimensions thereon.

Referring to FIG. 5, the rear cut feature discussed above in connection with FIGS. 4A and 4B is shown in an expanded form as being comprised of a subfeature labeled "Sketch9". Note that the feature list 68 of FIG. 5 shows a box connected to the left of the Rear Cut feature containing a minus sign rather than a plus sign, as shown in FIGS. 4A and 4B. As discussed above in connection with FIGS. 2 and 3, the minus sign in the box indicates that the feature connected thereto has been expanded to show subfeatures thereof.

A cursor arrow 76 is moved by using the mouse 34 in a conventional manner so that the end of the cursor arrow is coincident with an icon portion of the Rear Cut feature in the feature list 68. Once the cursor arrow 76 is placed on the icon for the Rear Cut feature, the user can double click the left button of the mouse 34 to modify the modeling portion 62 so that dimensions of the Rear Cut feature are superimposed onto the three-dimensional model 66. Once the dimensions are visible, the user can double click the left button of the mouse 34 to modify the dimensions. In a similar manner, moving the cursor arrow 76 onto the icon of other ones of the features from the feature list 68 and double clicking the left button of the mouse 34 will modify the drawing portion 62 to superimpose dimensions of the associated feature onto the model 66 or to perform some other appropriate action, as described in more detail hereinafter. A single click of the left button of the mouse 34 will highlight the feature from the feature list 68 and highlight the corresponding portion of the drawing 66.

Figure 6:
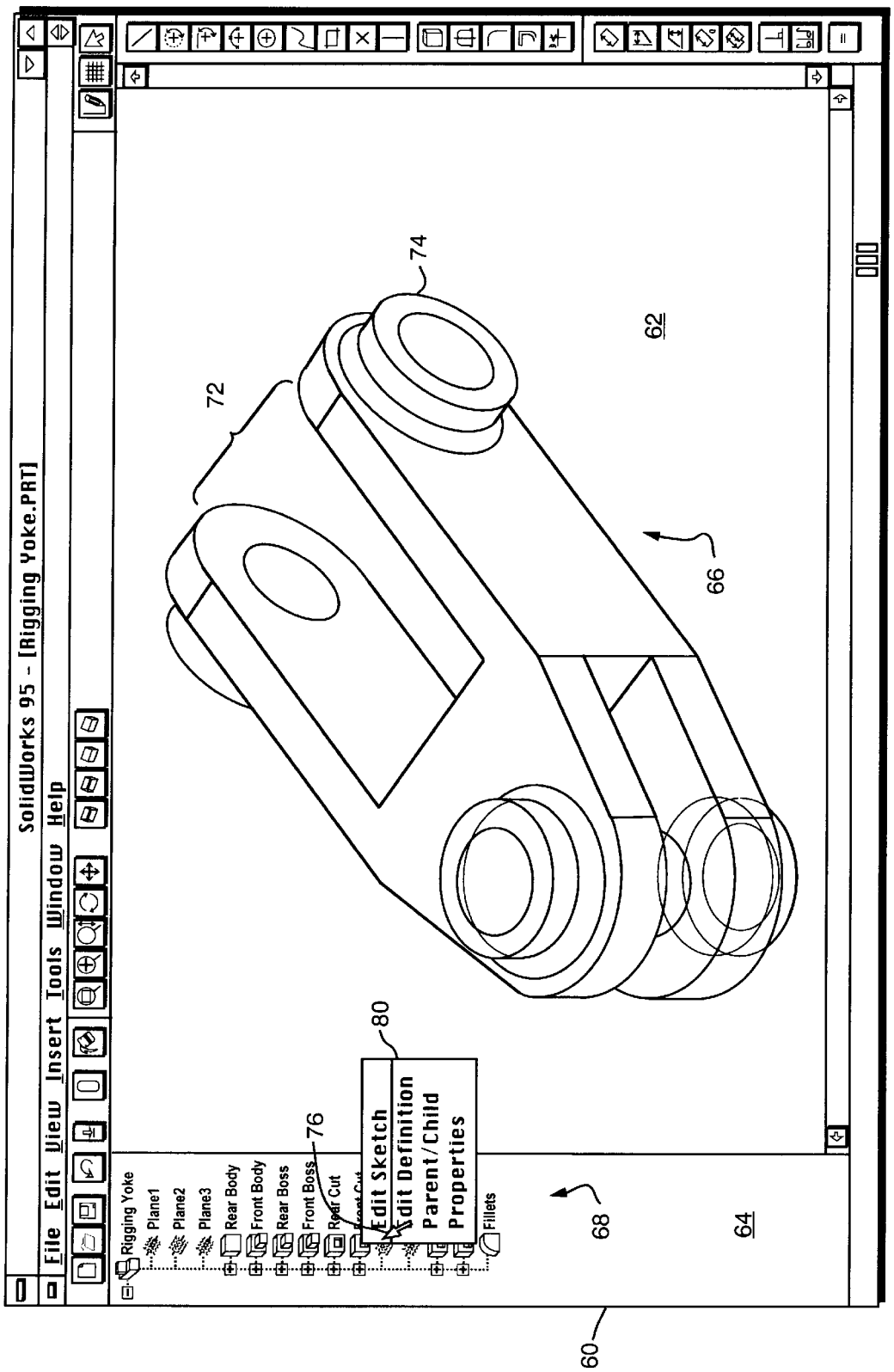
FIG. 6 is a window showing a model portion and a browser portion with a first pop-up menu superimposed thereon.

Referring to FIG. 6, a conventional pop-up menu 80 is provided by clicking the right button of the mouse 34 when the cursor 76 is placed on a particular one of the features from the feature list 68. The pop-up menu 80 of FIG. 6 results when the right button of the mouse 34 is clicked while the cursor 76 is placed on the Rear Cut feature. The pop-up menu 80 shows various options including an Edit Sketch option, an Edit Definition option, a Parent/Child option, and a Properties option. The user can select one of the options of the pop-up menu 80 in a conventional manner using the mouse cursor 76 and the right button of the mouse 34.

Figure 7:
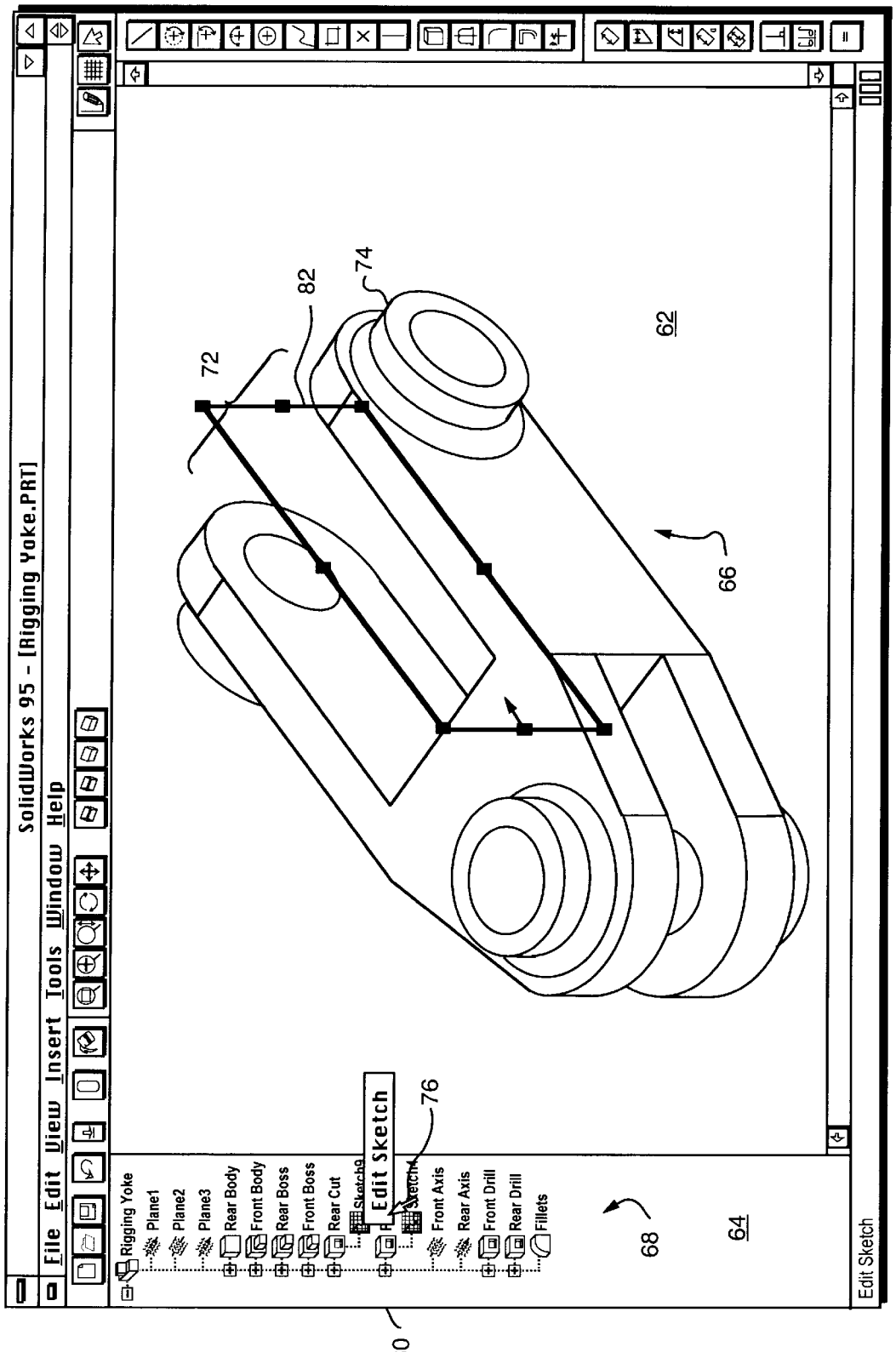
FIG. 7 is a window showing a model portion and a browser portion and illustrating a first option of the first pop-up menu.

Referring to FIG. 7, the effect of selecting the Edit Sketch option of the pop-up menu 80 of FIG. 6 is illustrated. Note that the rear cut 72 in the model 66 is made by first providing a sketch 82 and removing material in the model 66 corresponding to the sketch 82 projected a finite distance along a perpendicular axis thereof. Accordingly, selecting the edit sketch option shows the sketch 82 used to make the rear cut in the model 66. Once this option is selected, the user can modify the dimensions of the sketch 82 by moving the cursor 76 to selected points of the sketch 82 and shrinking or enlarging one or more dimensions of the sketch 82 in a conventional manner. Note that modifying the sketch 82 could change the location and amount of material removed from the model 66 by the Rear Cut feature.

Figure 8:
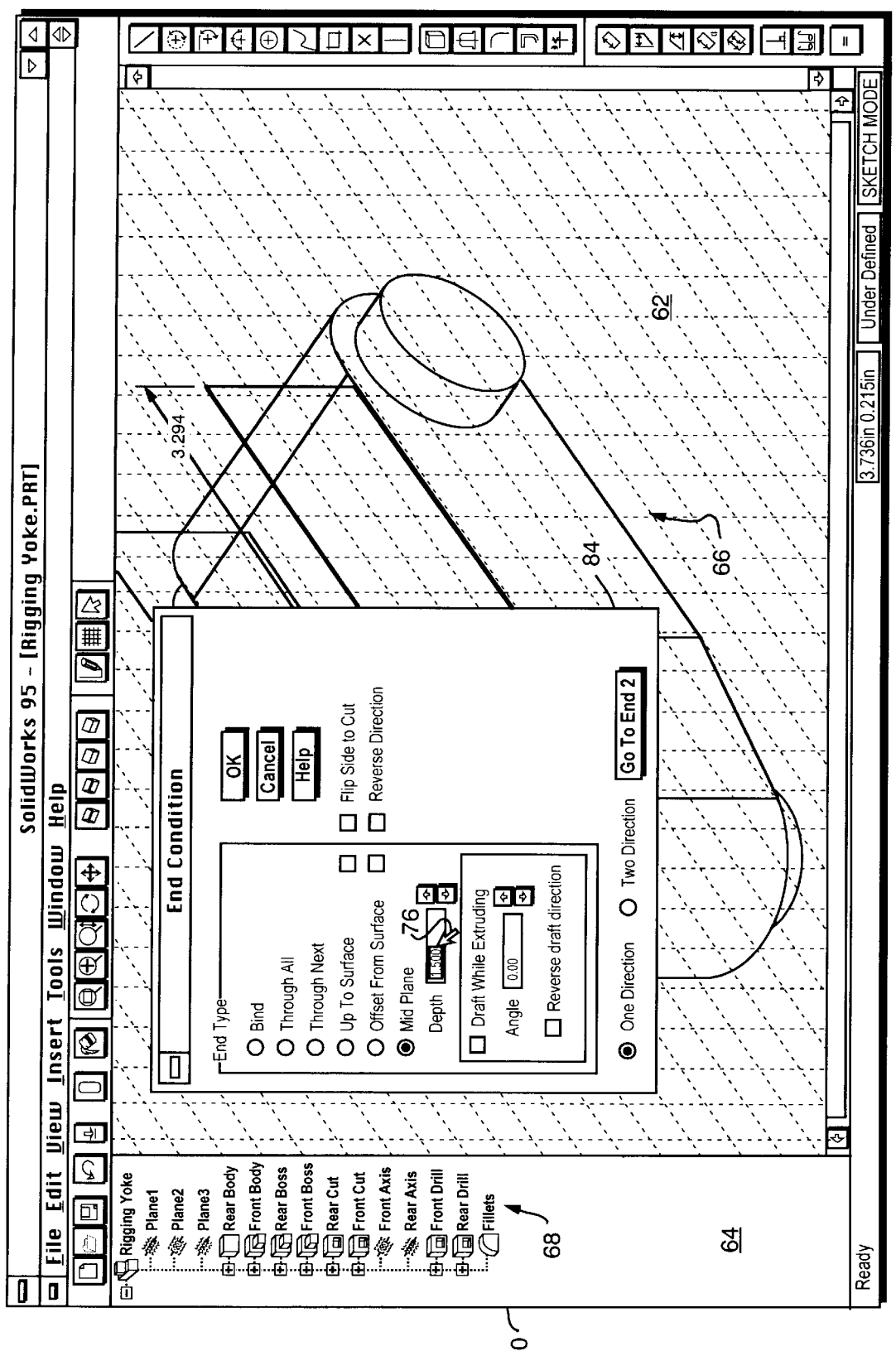
FIG. 8 is a window showing a model portion and a browser portion and illustrating a second option of the first pop-up menu.

Referring to FIG. 8, a window 84 is presented when the user selects the edit definition option from the pop-up menu 80 shown in FIG. 6. The window 84 shows various parameters that are part of the definition of the Rear Cut feature. Different types of features will show different types of windows when the edit definition feature is selected. The specific parameters that are provided for each type of feature is a design choice based on a variety of functional factors familiar to one of ordinary skill in the art.

The user can interact with the window 84 to modify elements therein in a conventional manner using the mouse 34 and/or the keyboard 33. For example, the user can modify the Depth element of the window 84 by pressing the right button of the mouse 34 and dragging the cursor 76 over the text associated with the Depth element to highlight the text as shown in FIG. 8. Afterward, the user can use the keyboard 33 to type in a new value for the Depth element.

Figure 9:
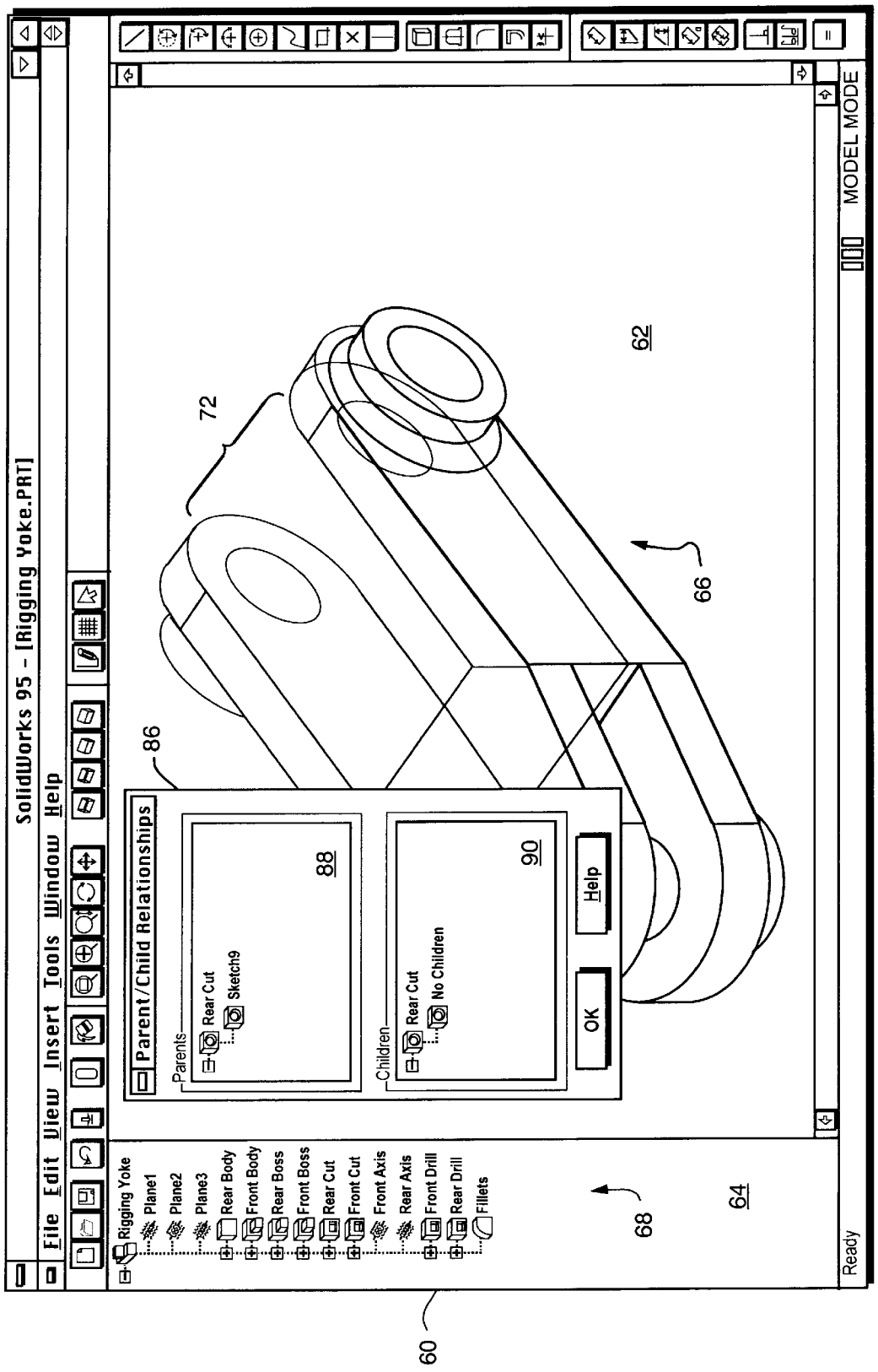
FIG. 9 is a window showing a model portion and a browser portion and illustrating a third option of the first pop-up menu.

Referring to FIG. 9, a window 86 is presented when the user selects the Parent/Child option from the pop-up menu 80 of FIG. 6. The Parent/Child option provides information about the parent and children relationships of the feature associated with the pop up window 80, in this case the Rear Cut feature. A parent-child relationship between features expresses dependency. Feature B is a child of feature A if B cannot exist without A. For example, consider a block feature A and a hole feature B drilled into the side of the block A. Hole B is a child of block A and block A is a parent of hole B. If block A is eliminated, hole B must also be eliminated.

The window 86 has a parent section 88 and a children section 90. The parent section 88 lists all of the features that are parent features of the Rear Cut feature. In the example shown in the window 86, the parent of the Rear Cut feature is the Sketch9 feature. Note that if the Sketch9 feature is eliminated, then the Rear Cut feature would also be eliminated since the rear cut is made by removing material from the model 66 corresponding to the Sketch9 feature projected a finite distance along a perpendicular axis thereof. The children portion 90 shows all of the children of the Rear Cut feature. In this particular instance, the Rear Cut feature has no children. Therefore, eliminating the Rear Cut feature will not necessitate elimination any other features of the drawing 66.

The ability to view the parent and child relationships of each of the features is very useful in that it allows the user to determine the effect of modifying or eliminating a particular feature. In the example of FIG. 9, the information in the parent/child window 86 indicates that the user can eliminate the Rear Cut feature without eliminating any other features of the drawing. The window 86 also indicates that eliminating the Sketch9 feature will necessitate elimination of the Rear Cut feature.

Figure 10:
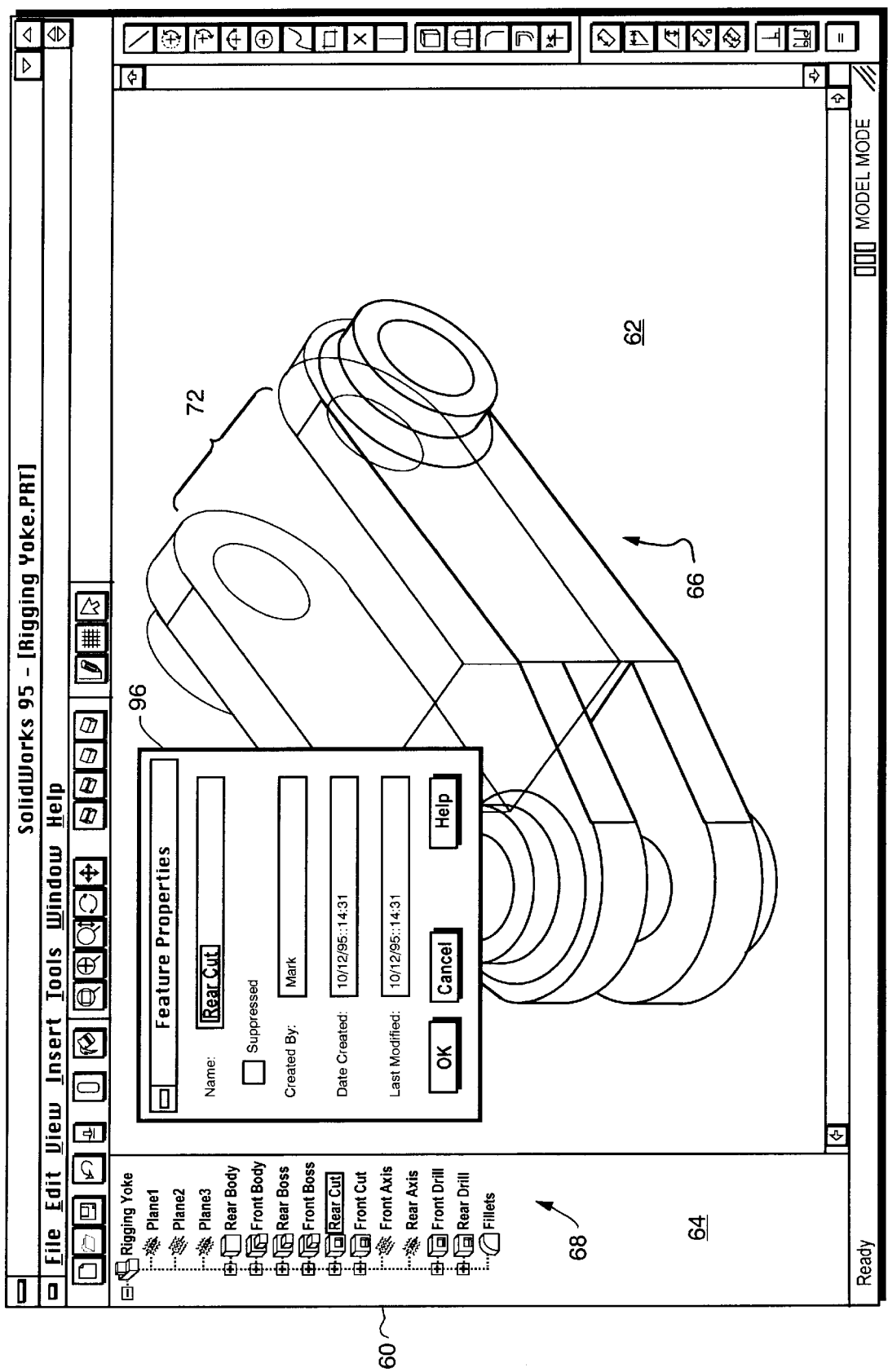
FIG. 10 is a window showing a model portion and a browser portion and illustrating a fourth option of the first pop-up menu.

Referring to FIG. 10, a window 96 is provided in response to the user selecting the Properties option of the pop-up menu 80 shown in FIG. 6. The properties shown in the window 96 are properties of the Rear Cut feature. Just as with the window 84 of FIG. 8, the user can modify items in the window 96 using the mouse 34 and/or the keyboard 33. Note that different types of features have different types of properties and so would probably provide a window different than the window 96 shown in FIG. 10. The specific properties that are shown for each type of feature are a design choice based on a variety of functional factors familiar to one of ordinary skill in the art.

Figure 11:
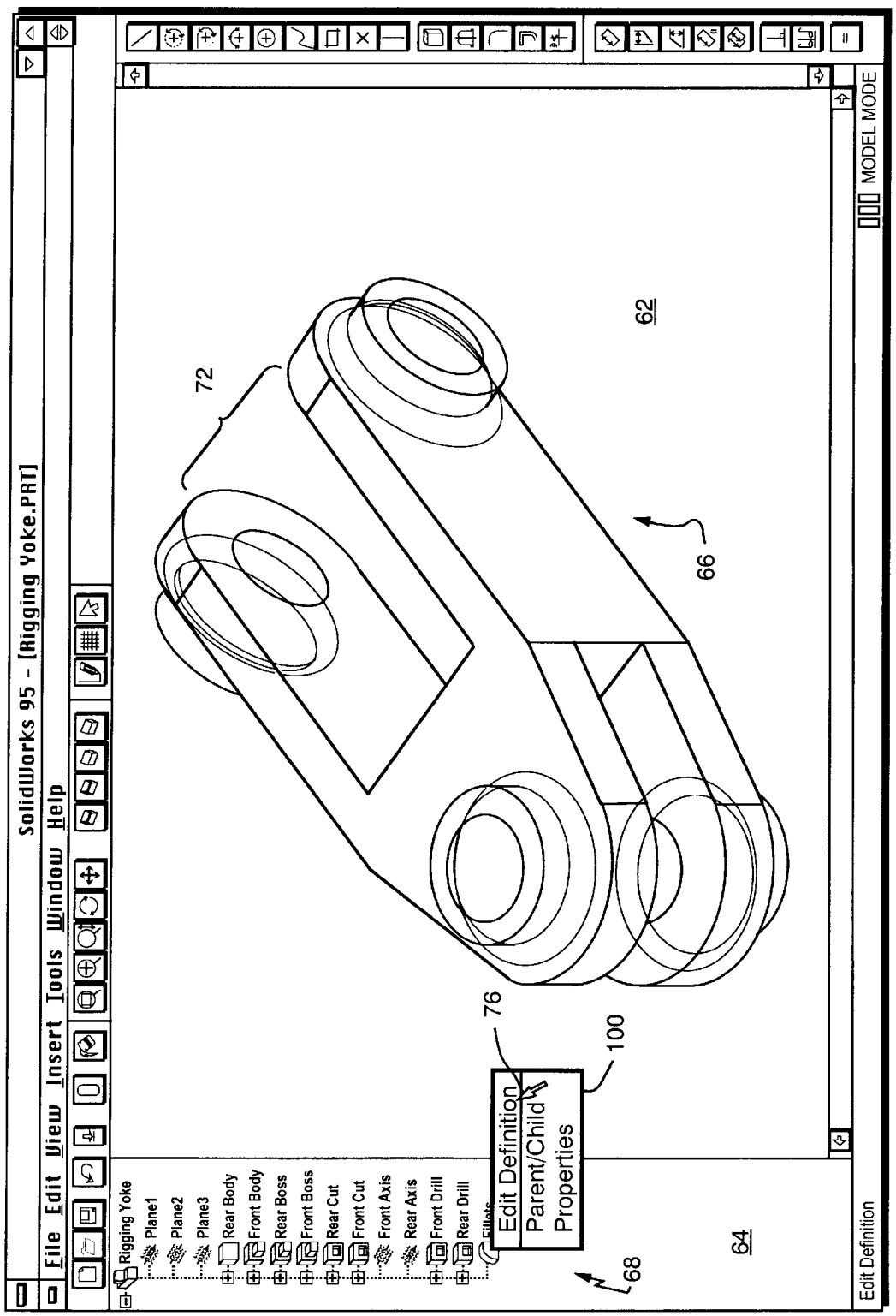
FIG. 11 is a window showing a model portion and a browser portion having a second pop-up menu superimposed thereon.

Referring to FIG. 11, a pop-up menu 100 is generated when the user places the cursor 76 over the Fillet feature and presses the right button of the mouse 34. A comparison of the pop-up menu 100 and the pop-up menu 80 of FIG. 6 illustrates that different pop-up menus can be used for different features. The pop-up menu 100 for the Fillet feature is different than the pop-up menu 80 for the Rear Cut feature. Each different type of feature can have a different pop-up menu associated therewith. The type, number of entries, and nature of entries of a pop-up menu is a design choice that depends on a variety of functional factors familiar to one of ordinary skill in the art.

Figure 12:
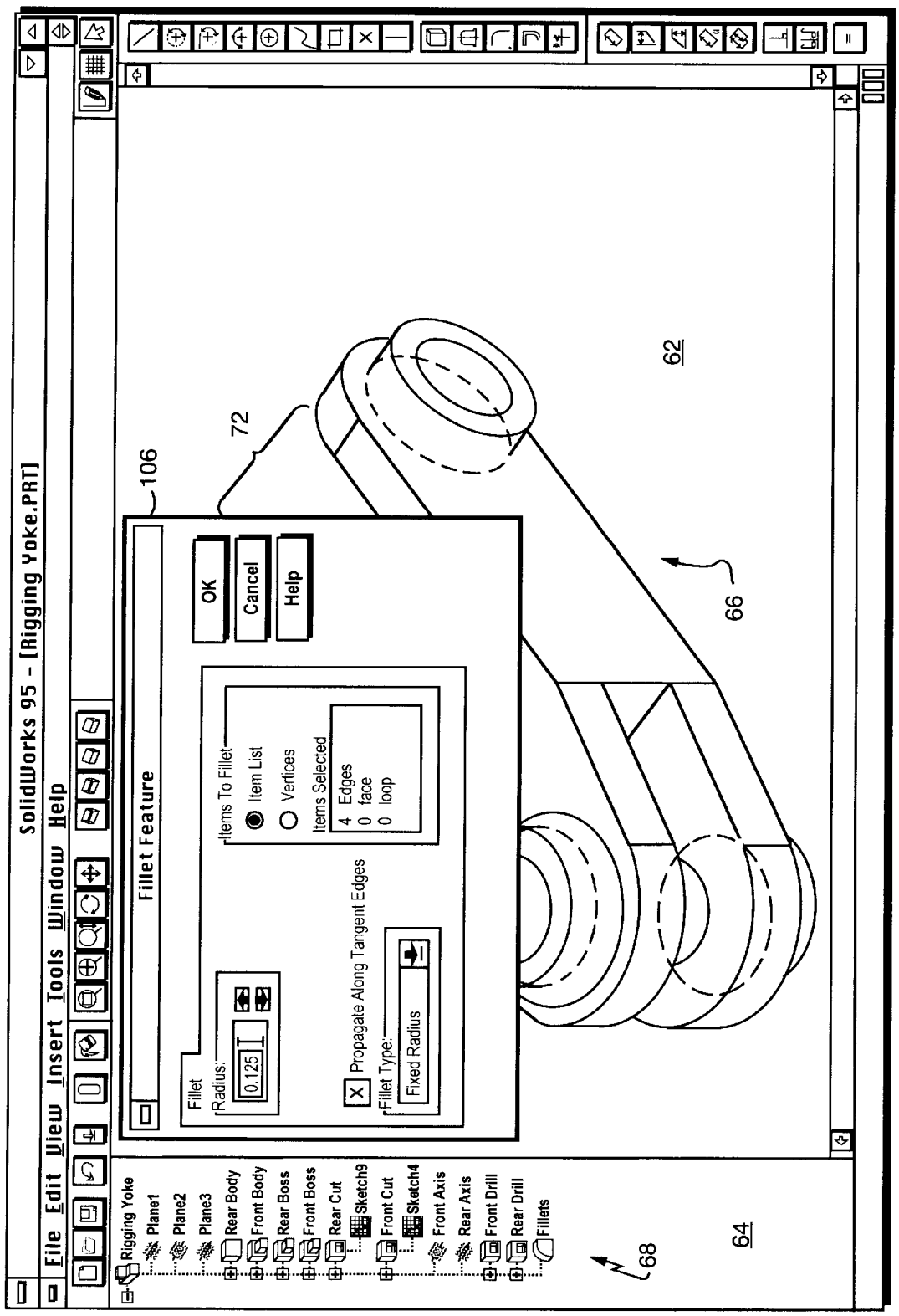
FIG. 12 is a window illustrating an option of the second pop-up menu.

Referring to FIG. 12, a window 106 is provided in response to the user selecting the Properties entry in the pop-up menu 100 of FIG. 11. Note that the window 106 is different than the window 96 of FIG. 10 which is provided when the user selects the Properties option from the pop-up menu 80 of FIG. 6 for the Rear Cut feature. This illustrates that even pop-up menu entries having the same name can differ for each feature in the feature list 68. The selection of which elements to provide in the feature list window 106 is a design choice that depends on a variety of functional factors familiar to one of ordinary skill in the art.

Figure 13:
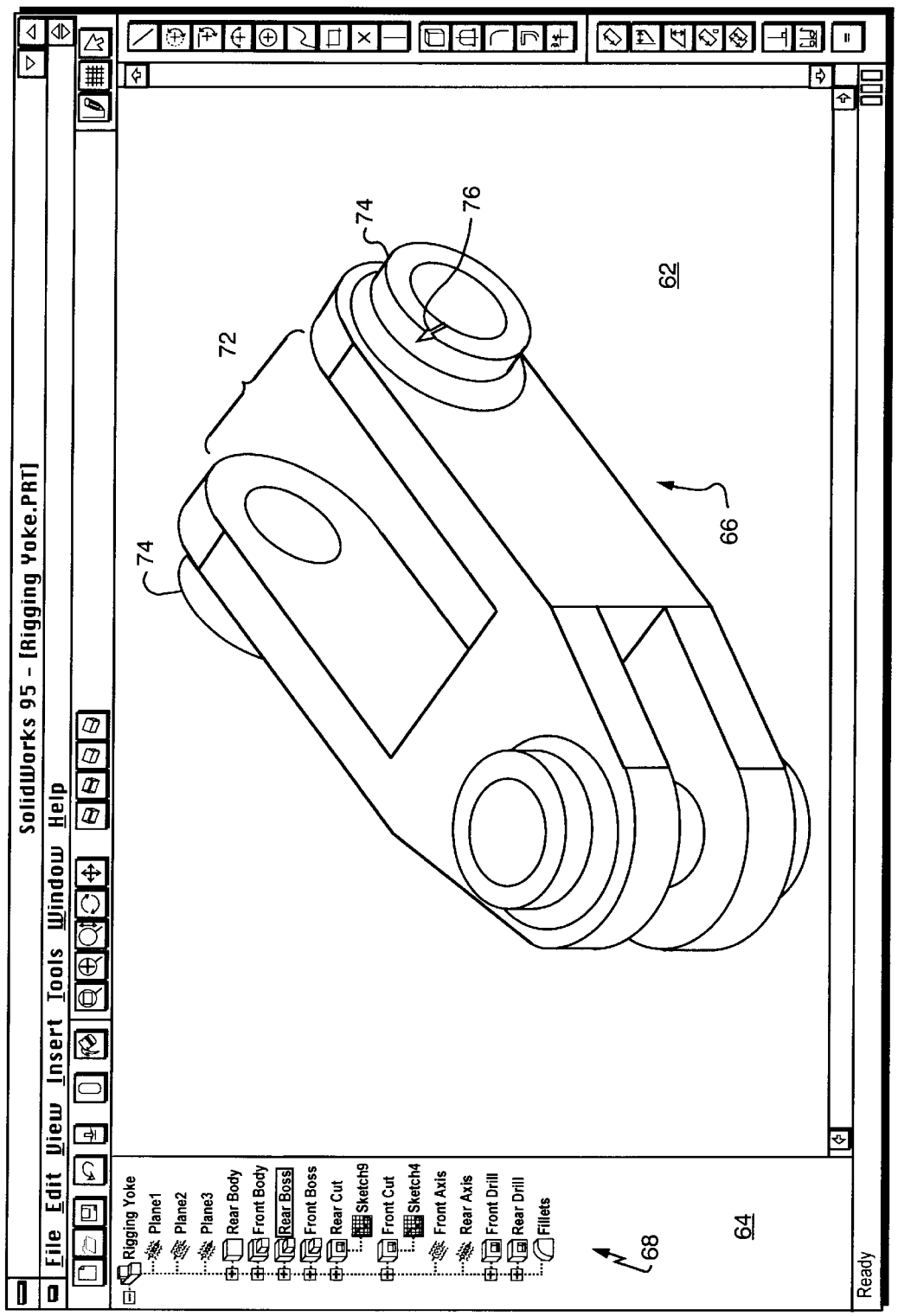
FIG. 13 is a window showing a model and illustrating a highlight option of the graphical browser.

Referring to FIG. 13, the drawing portion 62 is shown with the end of the cursor 76 coincident with the rear boss 74 portion of the model 66. Edges of the rear boss 74 are shown highlighted indicating that the user has single clicked the left button of the mouse 34 while the cursor 76 was in the position shown in FIG. 13. When this occurs, the Rear Boss feature from the feature list 68 is also highlighted by highlighting the associated text of the feature and changing the color of the icon. The icon color change is illustrated in FIG. 13 as a general darkening of the icon while text highlighting is shown by drawing the outline around the text of the feature. Text highlighting can also be provided by inverting the text in a conventional manner.

Highlighting allows the user to correlate faces or portions of the model 66 with specific features in the feature list 68. In addition, the user can move the cursor 76 over a particular feature in the feature list 68, click the left button of the mouse 34 one time, and cause both the selected feature in the feature list 68 and the associated edges in the model 66 to be highlighted. In this way, the user can correlate particular features from the feature list 68 with specific portions of the model 66.

Figure 14:
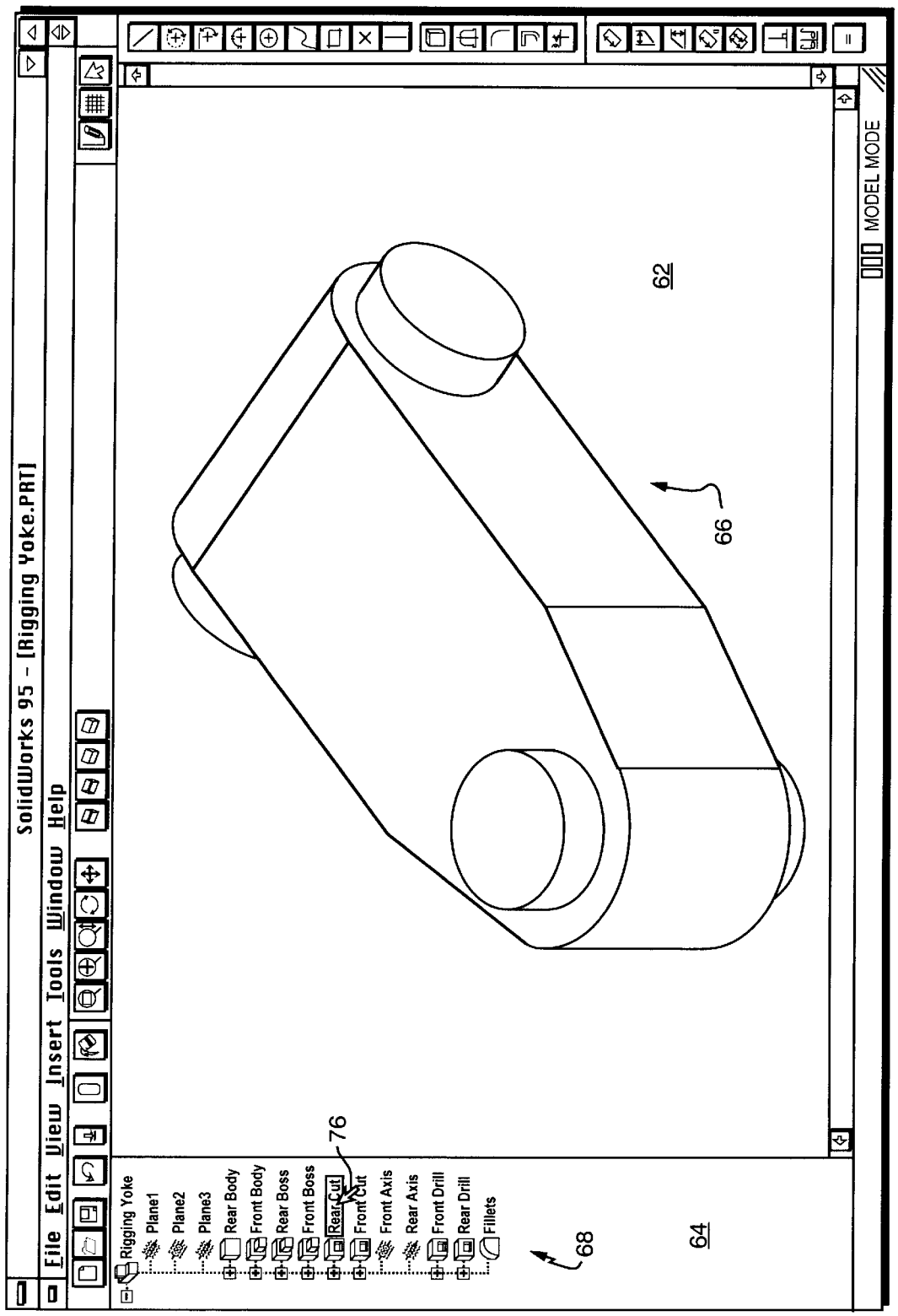
FIG. 14 is a window showing a model and illustrating a rollback option of the graphical browser.

Referring to FIG. 14, a rollback option is illustrated wherein features of the model 66 that follow a particular feature are not shown in the drawing portion 62. FIG. 14 shows the cursor 76 being placed on the Rear Cut feature of the feature list 68. The model 66 is shown with every feature from the Rear Cut downward (i.e, after the Rear Cut feature) eliminated. That is, the model 66 is shown without the Rear Cut, Front Cut, Front Drill, Rear Drill, and Fillets features from the feature list 68. A model can be rolled back to any feature shown in the feature list 68. Rolling back is useful for simplifying and debugging the model 66.

Figure 15:
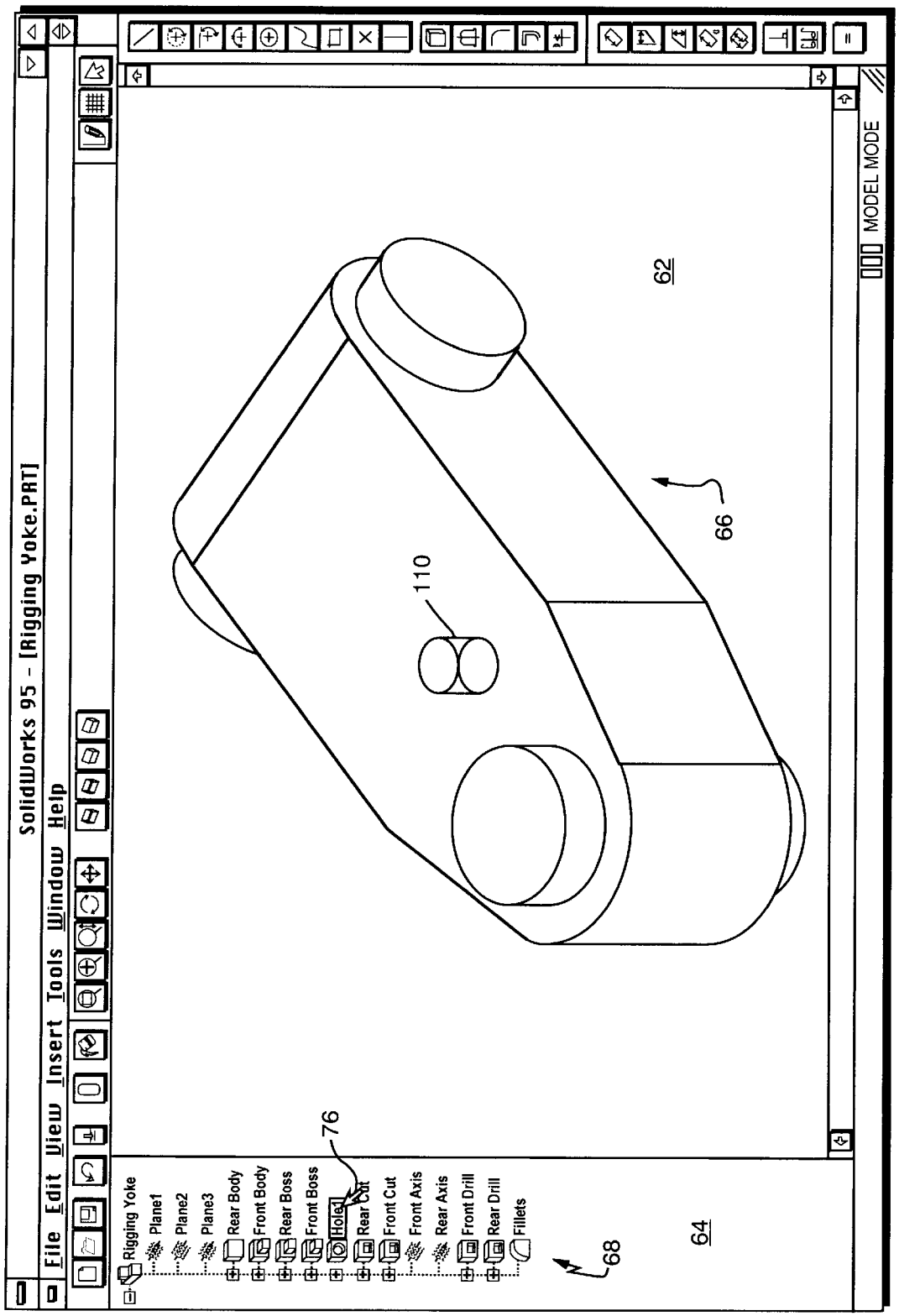
FIG. 15 is a window showing a model and illustrating an insert option of the graphical browser.

Referring to FIG. 15, an insertion option is illustrated wherein a new feature can be inserted at the rollback point shown in FIG. 14. In this case, the cursor 76 is pointing to a new feature labeled "Hole1". A hole 110 on the model 66 illustrates the Hole1 feature of the feature list 68. Note that the remainder of the features from the feature list 68 remain suppressed in FIG. 15 in the same way as the features are suppressed in FIG. 14.

Figure 16:
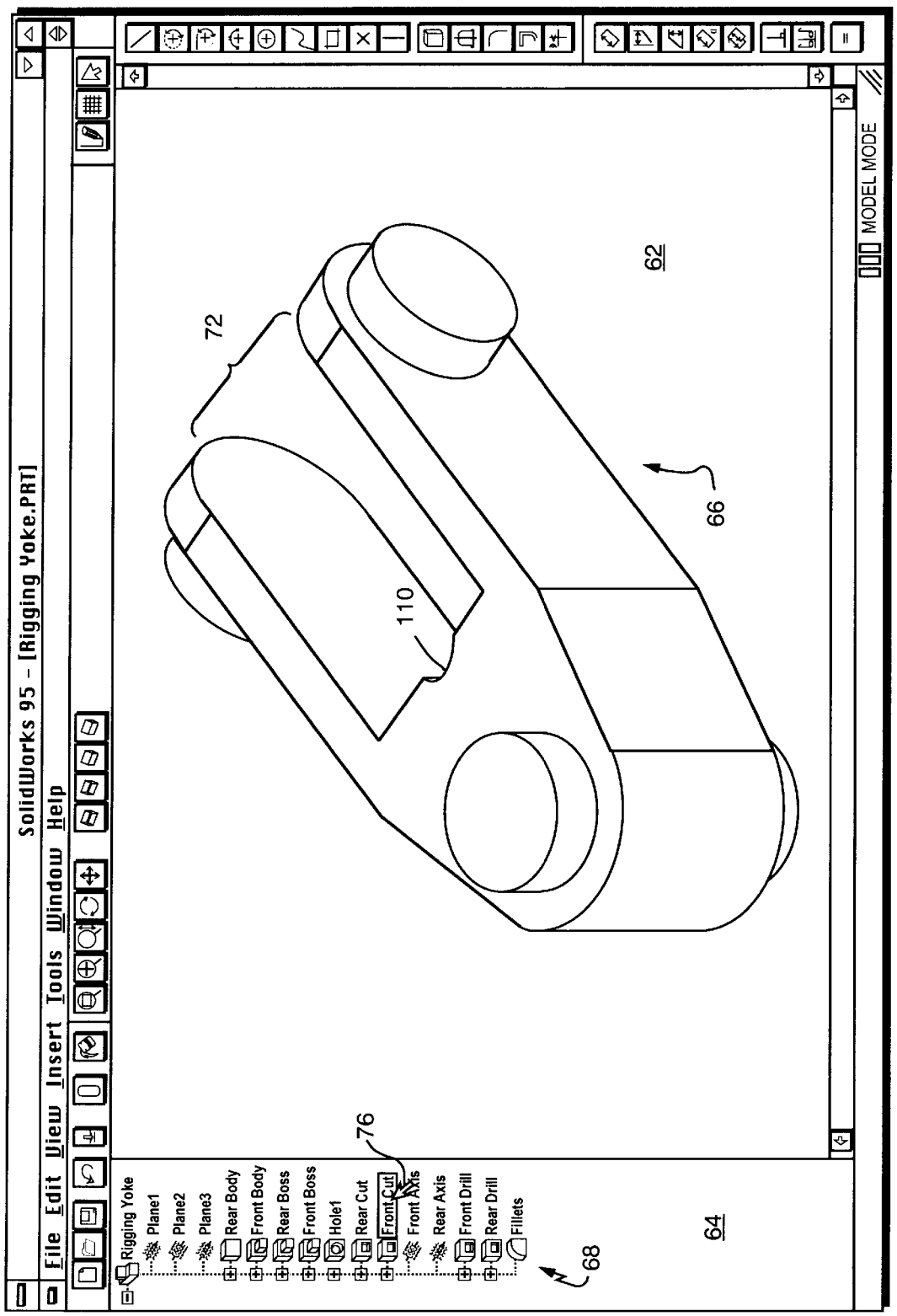
FIG. 16 is a window illustrating an option for stepping forward through features of the graphical browser.

Referring to FIG. 16, a stepping option is illustrated wherein the user can step one feature at a time through the rollback state in order to cause features to reappear, one at a time, in the model 66. As shown in FIG. 16, the cursor 76 has selected the Front Cut feature from the feature list 68. Accordingly, the model 66 is in a state that is rolled back to prior to insertion of the Front Cut so that the Front Cut, Front Drill, Rear Drill, and Fillets features are not shown on the model 66. Note that in this state, the rear cut 72 is shown in the model 66. Note also that the hole 110 is only partially shown since a portion of the hole 110 and a portion of the rear cut 72 overlap. In addition, unlike FIG. 15, the hole 110 is not shown in wire frame since the Hole1 feature is not selected from the feature list 68, as was the case in FIG. 15. Note that rolling back and stepping through the feature list 68 one feature at a time can be an efficient way to simplify and debug the model 66.

Figure 17:
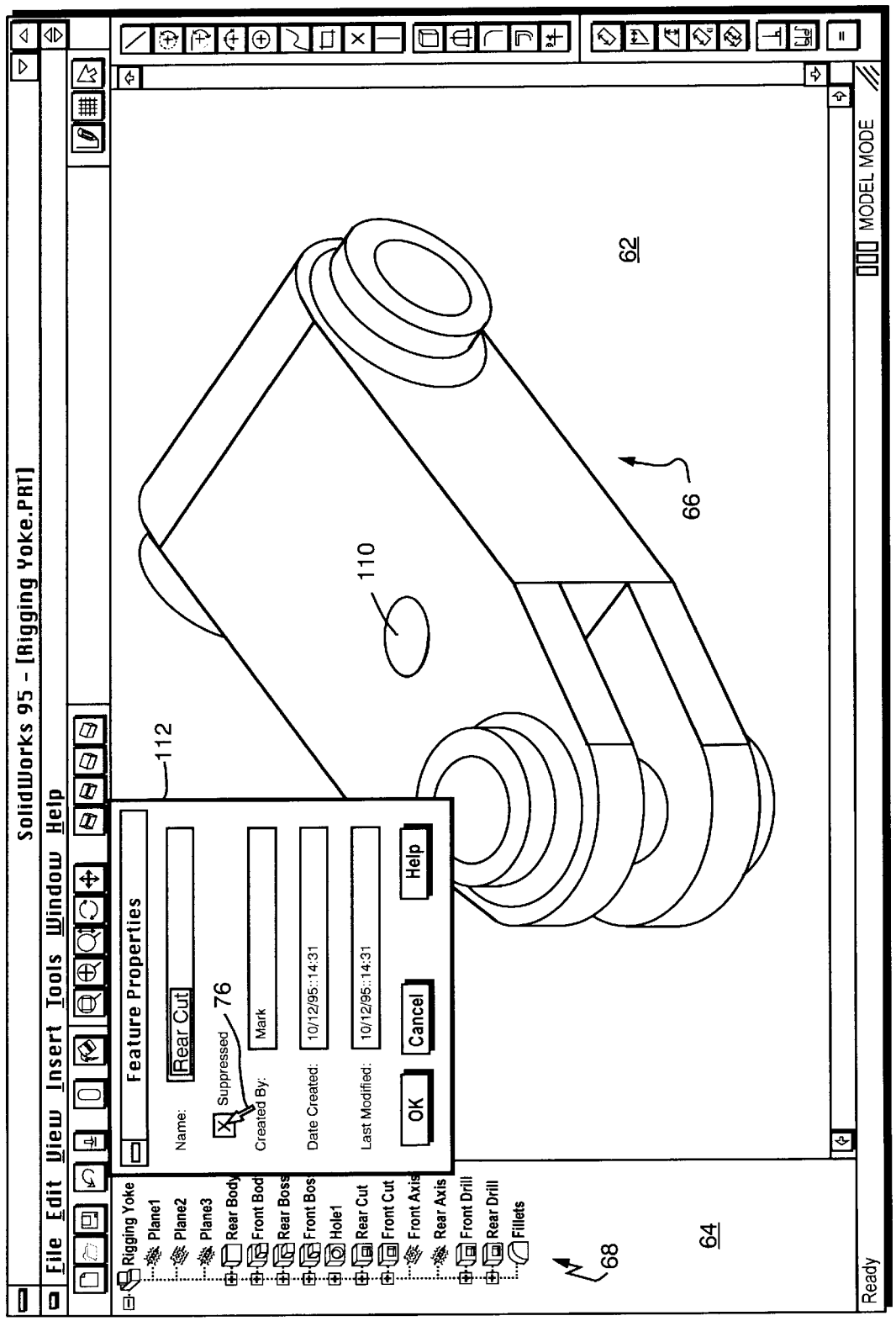
FIG. 17 is a window containing a model portion and a browser portion and illustrating an option for showing feature properties.

Referring to FIG. 17, an option for suppression of a single feature is illustrated. A dialog box 112 shows the cursor 76 being used to select suppression of the Rear Cut feature. The model 66 shows all of the features in the feature list 68 except the suppressed feature, the Rear Cut feature. Note that suppression of a single feature, as illustrated in FIG. 17 is different than rolling back the model 66 as shown in FIG. 14 because the model 66 shown in FIG. 17 contains all of the features in the feature list 68 except the suppressed feature (Rear Cut) while the model 66 shown in FIG. 14 contains only those features of the feature list 68 which precede the Rear Cut feature. That is, the model 66 of FIG. 14 does not show the Front Cut, Front Drill, Rear Drill, and Fillets features while the model 66 of FIG. 17 does show those features. The ability to suppress a single feature can be useful in simplifying and debugging a model.

Note that features similar to the roll back, suppression, insertion, and stepping option illustrated in FIGS. 14–17 are known in the art. However, implementing these options using the feature list 68 facilitates ease of use and visualization by the user who, with only the modeling portion 62 visible, would likely be reduced to guessing as to the ordering of features and the effect of, say, rolling back to a particular one of the features.

Figure 18:
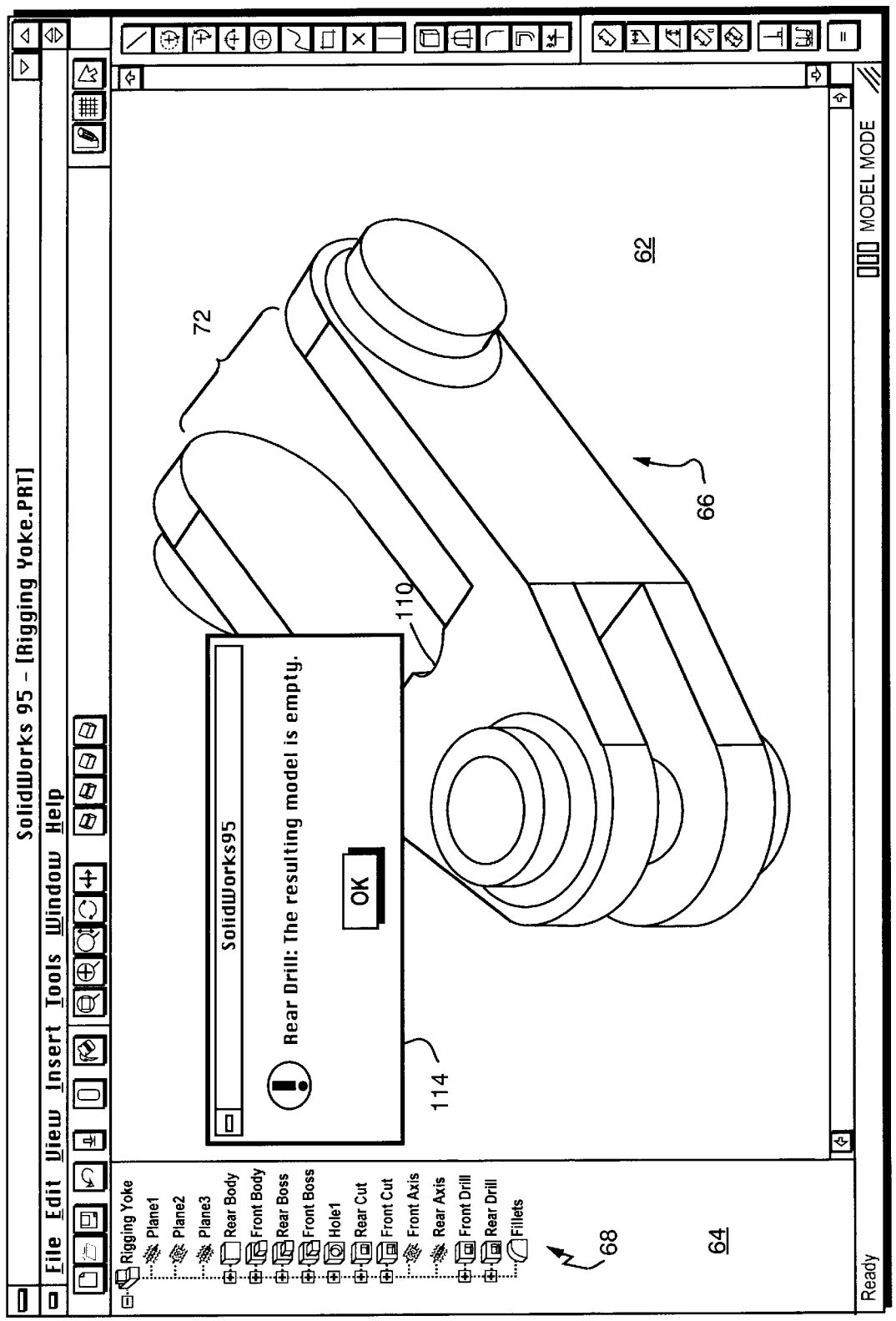
FIG. 18 is a window containing a model portion and a browser portion and illustrating an option for showing modeling errors.

Referring to FIG. 18, a dialog box 114 reports an error in the Rear Drill feature of the feature list 68. The error was artificially created by expanding the dimensions of the Rear Drill feature to beyond the size of the entire model 66. Note that in addition to reporting the error in the dialog box 114, the icon associated with the Rear Drill feature in the feature list 68 is highlighted, thus providing the user with a visual representation in the feature list 68 showing the source of the error in the model 66 that caused the dialog box 114 to be generated.

Figure 19:
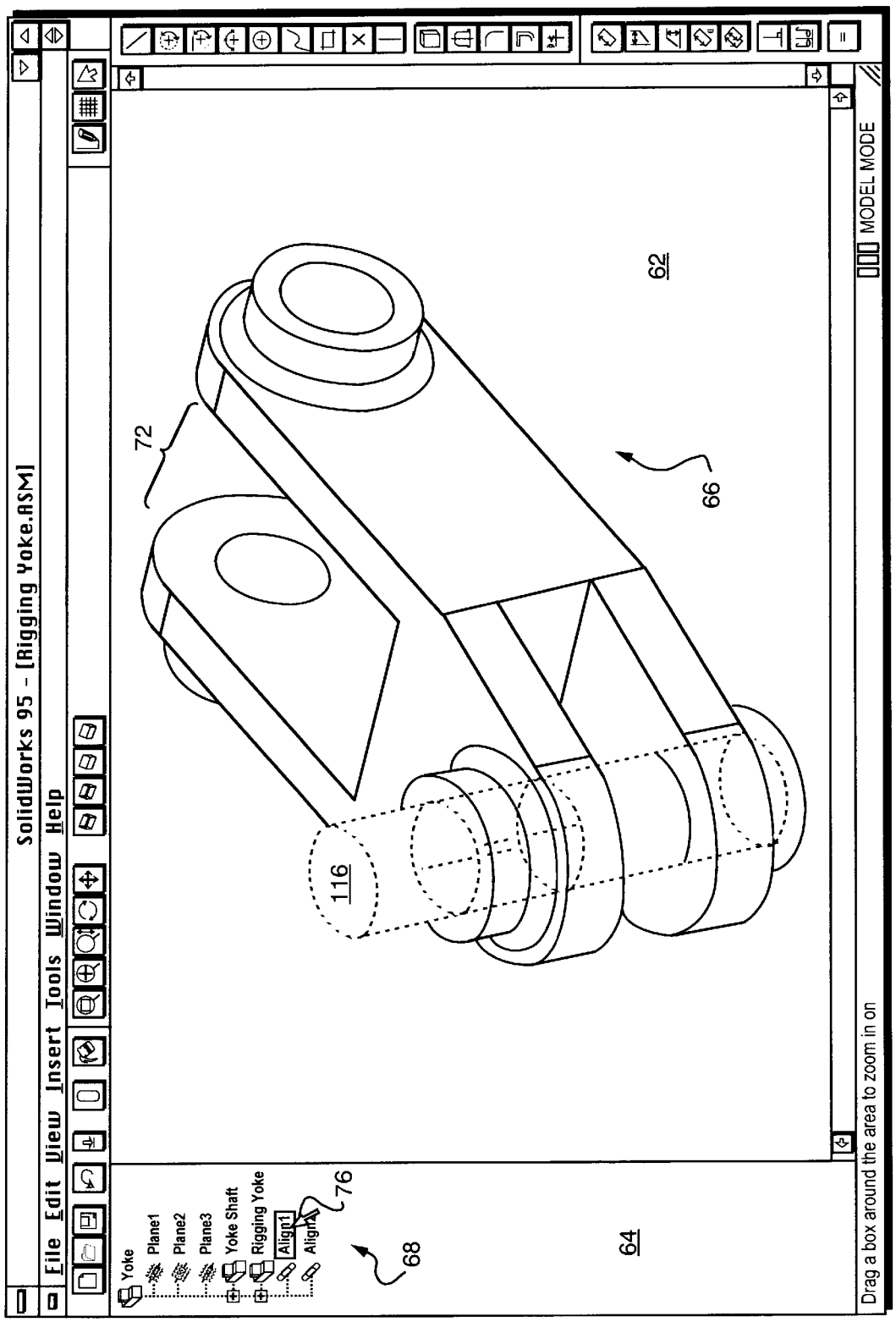
FIG. 19 is a window containing a model portion and a browser portion and illustrating an option for showing alignment features of the model.

Referring to FIG. 19, the model 66 is illustrated with a shaft 116 inserted in a front hole of the model 66. In order for the shaft 116 to remain properly inserted into the front hole, it is essential that the relative alignment of the shaft 116 and the remainder of the model 66 remain constant irrespective of any changes in orientation of the model 66. That is, moving the shaft 116 should also cause the remainder of the model 66 to move the same amount. Otherwise, the shaft 116 will not maintain alignment in the front hole of the model 66 as shown in FIG. 19. Accordingly, when the shaft 116 is created, the user can specify specific alignment between the shaft 116 and the model 66. In FIG. 19, the alignment of the shaft 116 is constrained two separate ways: the bottom face of the shaft 116 is aligned with the bottom face of the boss located in the front of the model 66 and the outside face of the shaft 116 is aligned with the inside face of the hole through which the shaft 116 is placed. These two separate alignments are shown in the feature list 68 as "Align1" and "Align2" features. Note that the general technique of aligning models are known to one of ordinary skill in the art.

The user may be interested in seeing which faces of the shaft 116 and the model 66 are aligned. The user can do this by placing the cursor 76 over one of the aligned features in the feature list 68 and clicking on the left button of the mouse 34. Clicking on the left button causes the feature in the feature list 68 to be highlighted and causes the faces which are aligned to also be highlighted in the model portion 62. For example, as shown in FIG. 19, the user has clicked the left button of the mouse 34 on the Align1 feature in the feature list 68 and caused the outside circumferential face of the shaft 116 to be highlighted and has caused the inside face of the hole through which the shaft 116 passes to also be highlighted. The ability to highlight faces that are aligned is useful in keeping track of various alignment constraints of a model being constructed by the user.

Figure 20B:
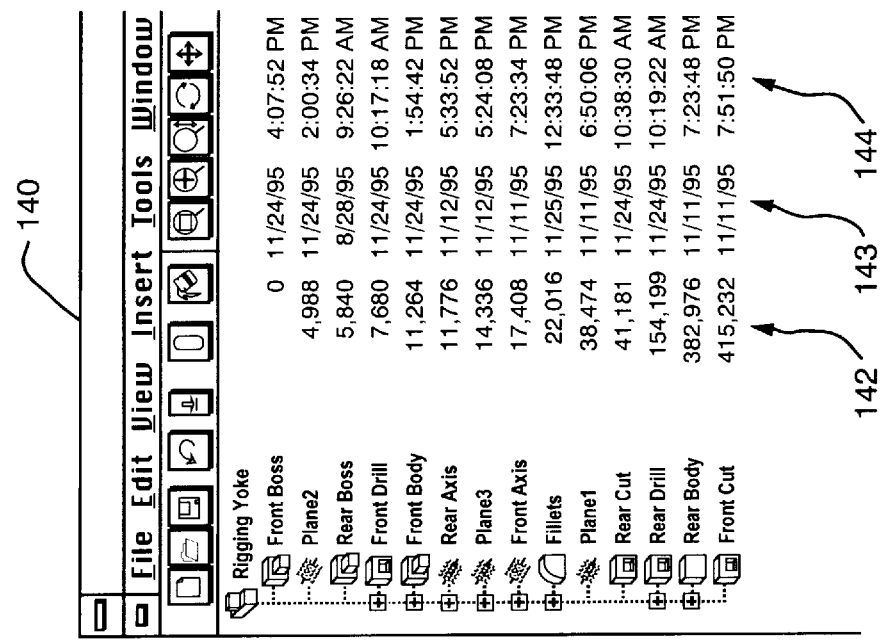
FIGS. 20A and 20B are windows illustrating a sorting option of the graphical browser using various criteria for sorting.
Figure 20A:
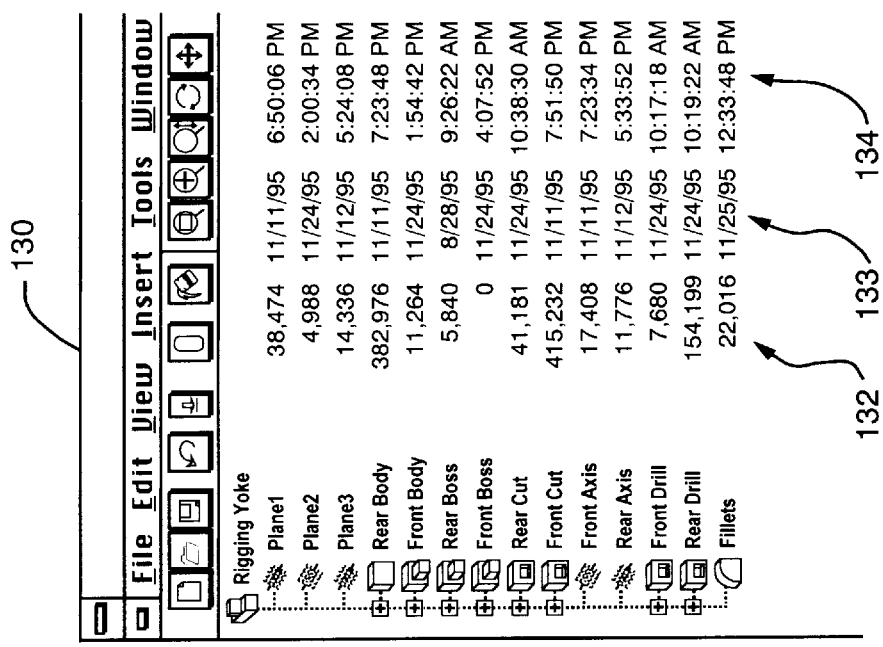

Referring to FIG. 20A, a window 130 shows the list of features from the feature list 68 along with three columns 132–134 which show an amount of memory required to store each of the features, date of last modification of each of the features and a time of modification of each of the features, respectively. The window 130 represents a different way to present information about features in the feature list 68.

Referring to FIG. 20B, a window 140 also shows features from the feature list 68. In addition, the window 140 has three columns 142–144 similar to the columns 132–134 of FIG. 20A. Note that the ordering of the features in the window 140 is by the amount of memory used to store each feature shown in the column 142. The feature which requires the least amount of memory storage is shown at the top of the list followed by the feature requiring the next most amount of memory storage and so forth until the feature at the bottom of the list requires the greatest amount of memory storage. FIGS. 20A and 20B illustrate that the features of the feature list 68 can be sorted and presented in any convenient manner that facilitates use and access by the user. It would have also been possible to show the features of the feature list 68 being sorted by any other criteria including, for example, being sorted in alphabetical order by feature name.

Figure 21:
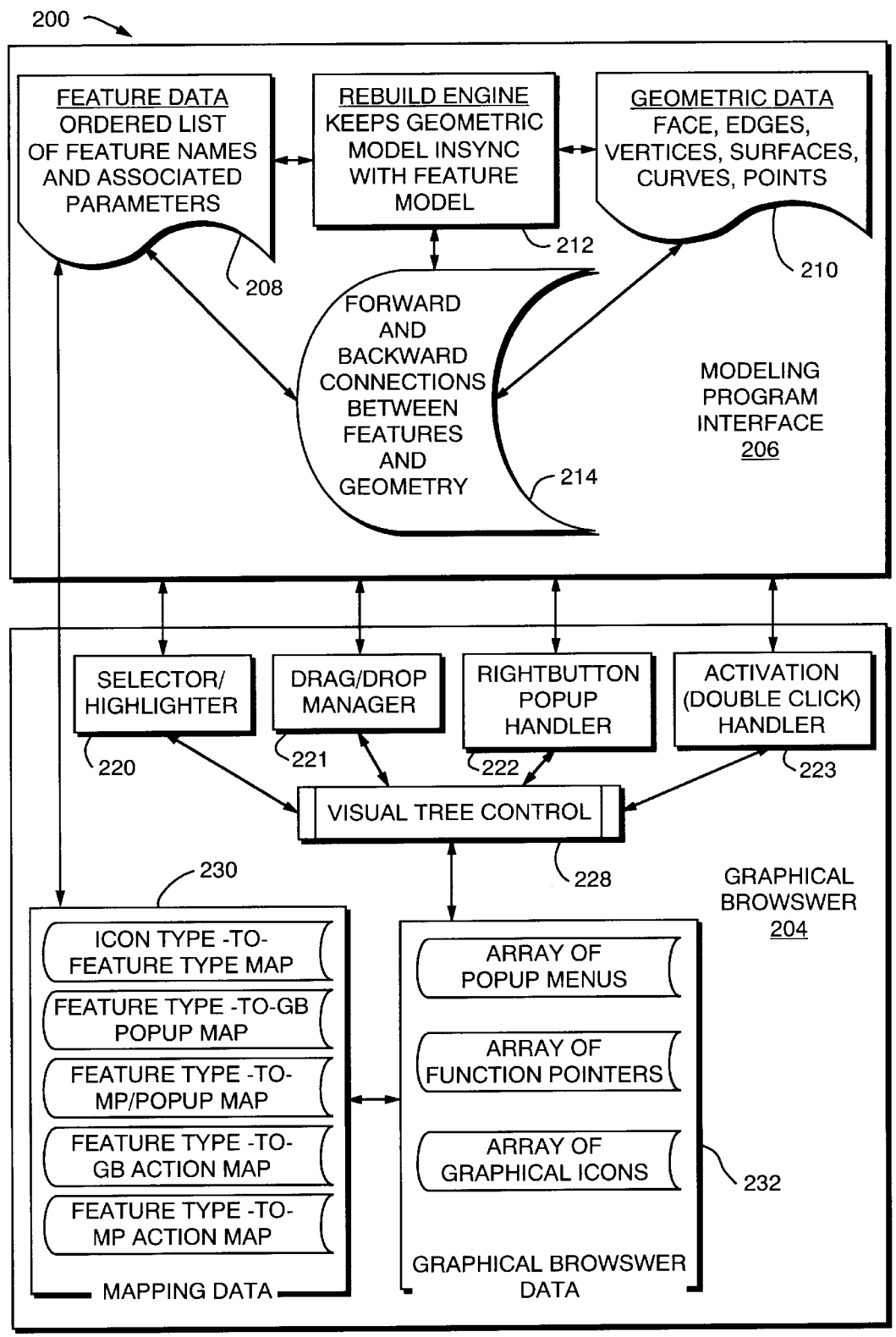
FIG. 21 is a data flow diagram illustrating interfacing and data exchange between a conventional modeling program and the graphical browser.

Referring to FIG. 21, a data flow diagram 200 illustrates interfacing between graphical browser software 204 and a modeling program 206. The graphical browser 204 can be implemented in conjunction with almost any computer modeling program in a manner described in detail below. The graphical browser 204 conducts operations on the data of a modeling program to provide the functionality illustrated above. Accordingly, the graphical browser 204 operates essentially independently of the executable code of the modeling program. Interfacing a conventional, generic, computer modeling program with the graphical browser consists essentially of interfacing the modeling program with the graphical browser to provide the graphical browser 204 with access to the modeling data of the modeling program. Details of this interface, including preferred data formats, are described in detail below.

The modeling program interface 206 includes data used by the graphical browser 204 to perform the operations illustrated in FIGS. 1–20 and discussed above. The interface data includes feature data 208 and geometric data 210. The feature data 208 contains a list of the features (e.g., planes, extrusions, lines, et cetera) of the model. The feature data 208 is implemented using conventional computer data storage means and is constructed/modified as the user creates and modifies the object being drawn.

The geometric data 210 represents computer data (stored by conventional means) indicative of the faces, edges, vertices, surfaces, curves, points, and other low level geometric characteristics of the model. The modeling program can use the geometric data 210 to display the model on the screen.

A rebuild engine 212 converts the feature data 208 to the geometric data 210. The rebuild engine 212 is executable code that converts each element of the feature data 208 into corresponding edges, faces, vertices, et cetera of the geometric data 210. The rebuild engine 212 also provides connections data 214 indicating forward and backward connections between features and geometry. That is, the connections data 214 contains entries for each feature in the feature data 208 indicating the particular faces, edges, vertices, et cetera that correspond to each of the low level features of the geometry data 210. In addition, the connections data 214 also contains information that relates each entry in the geometric data 210 with one or more features in the feature data 208. Using the connections data 214, it is possible to correlate each feature in the feature data 208 with the resulting geometric data 210 and it is possible to correlate each entry of the geometric data 210 with features in the feature data 208.

The feature data 208, geometric data 210, rebuild engine 212, and connections data 214 can be implemented in conjunction with the modeling program in a variety of conventional manners in order to provide the modeling program interface 206. One example of this type of modeling data storage/presentation/conversion is found in a publication titled "Geometric Modeling" by Michael E. Mortenson, copyright 1985 and published by John Wiley & Sons, Inc. of New York, N.Y., ISBN 0-471-88279-8. It is also possible to implement the modeling program interface 206 in a variety of other conventional manners, provided that the feature data 208, geometric data 210, and connections data 214 are available for use by the graphical browser 204 to provide the functionality described below in connection with the detailed discussion of the graphical browser 204.

Note that various ones of the options, such as feature suppression, rolling back, and feature insertion, can be implemented in conjunction with a modeling in a variety of conventional manners. For example, feature suppression and rolling back can be implemented by having a data field for each feature indicating whether the feature is suppressed. If the graphical browser 204 writes to the field to indicate that a particular feature is suppressed, then the rebuild engine 212 treats that feature as if the feature does not exist, thus suppressing generation of corresponding geometry data 210 and modifying the display of the model accordingly.

The graphical browser 204 includes a selector/highlighter code module 220, a drag/drop manager code module 221, a right button pop-up handler code module 222, and an activation handler code module 223. The code modules 220–223 interact with the modeling program interface 206 by receiving and sending data thereto. Operation of the code modules 220–223 is described in more detail below.

The code modules 220–223 interact with a visual tree control code module 228. The visual tree control module 228 is a commercially available software package, is provided by Microsoft Corporation of Redmond, Wash., that handles the graphical browser user interface in a manner described in more detail below. Specific aspects of the user interface illustrated in FIGS. 1–20 and not discussed below are provided by the visual tree control module 228.

The graphical browser 204 also includes mapping data 230 that correlates various feature types and characteristics thereof. The mapping data 230 includes an icon type to feature type map which correlates specific types of features (e.g., planes, fillets, et cetera) with specific icons therefore that are shown on the graphical browser screen. Examples of different types of icons for different features are shown throughout the examples given in FIGS. 1–20. The mapping data 230 also includes a feature type to graphical browser pop-up menu map. This map correlates the specific pop-up menus that are provided in connection with different types of features. As discussed above in connection with FIGS. 1–20, each feature can have a different pop-up menu associated therewith.

The mapping data 230 also contains a feature type to modeling portion pop-up menu map. This map is similar to the feature type to graphical browser pop-up map except that it correlates feature types with pop-up menus that appear in the modeling portion rather than feature types with the pop-up menus that appear in the feature window. For each type of feature, it is possible to have a different pop-up menu appear in the graphical browser portion versus the modeling portion.

The mapping data 230 also contains two additional maps: feature type to graphical browser action map and a feature type to modeling portion action map. These maps contain pointers to executable code that is run in connection with double clicking the left button of the mouse when the mouse cursor is on either a portion of the model in the modeling window or on an icon in the graphical browser. Note that just as it is possible for a particular feature to have different pop-up menus that appear in either the graphical browser portion or the modeling portion, then too it is possible for a feature to have different actions associated therewith depending upon whether the feature is selected in the graphical browser portion or the modeling portion.

Some of the entries in the mapping data 230 are provided by graphical browser data 232 which contains arrays of pop-up menus, function pointers, and graphical icons. Other entries in the mapping data 230 are provided by the feature data 208 through the modeling program interface 206. Accordingly, each entry in each map of the mapping data 230 contains one element from the feature data 208 and one element from the graphical browser data 232. Note that the arrays of pop-up menus, the arrays of function pointers, and the arrays of graphical icons found in the graphical browser data 232 can be stored and accessed in a conventional manner to the graphical browser 204.

Figure 22:
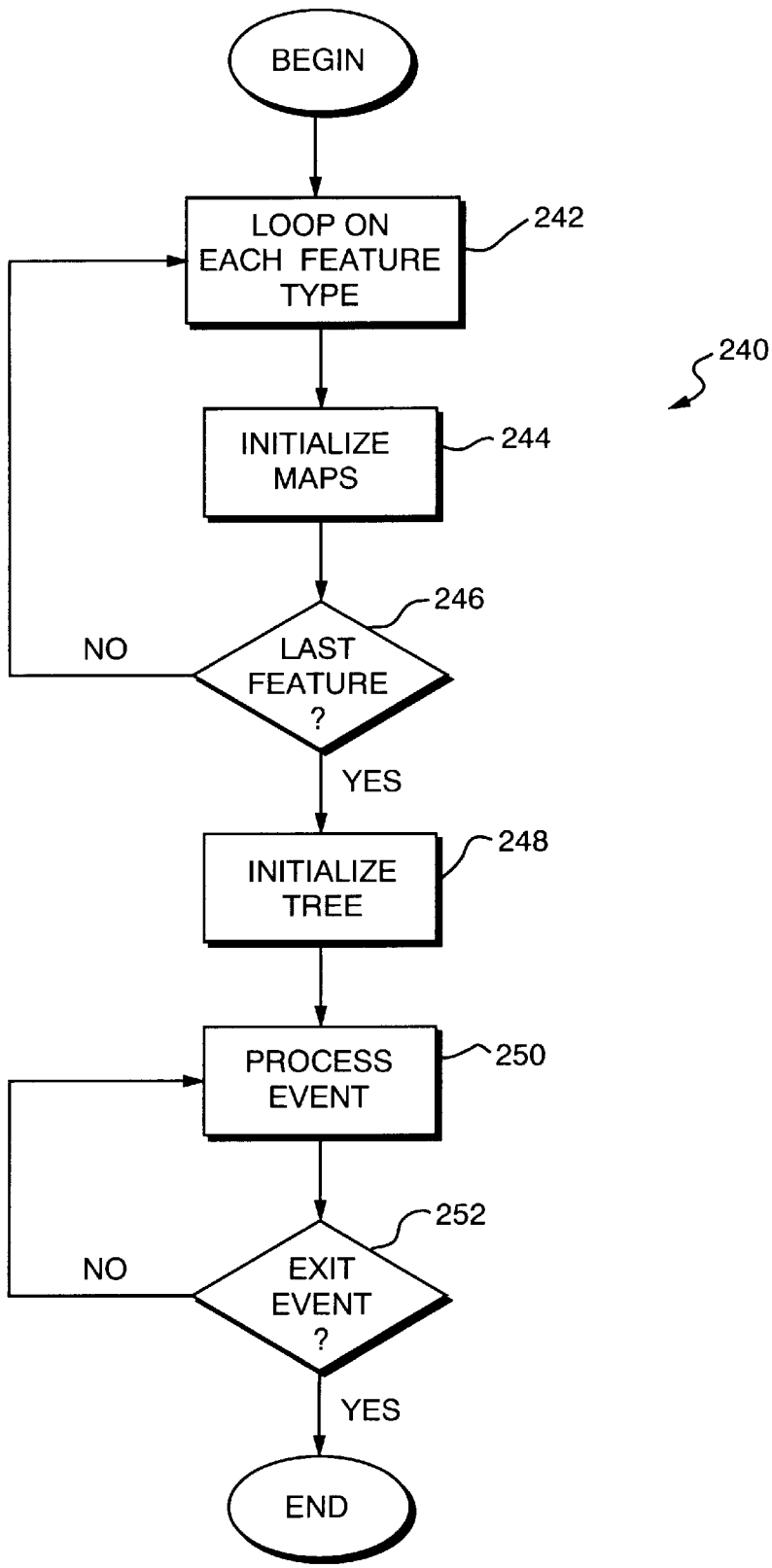
FIG. 22 is a flow chart showing overall operation of the graphical browser.

Referring to FIG. 22, a flow chart 240 illustrates overall operation of the graphical browser 204. At a first step 242, a loop variable is initialized to loop on each of the different types of features used by the graphical browser 204. Following the step 242 is a step 244 where the maps of the mapping data 230 are initialized for each of the features represented by the loop variable representing each of the features. For example, for the fillets feature, the initialize maps step 244 would initialize the mapping data 230 to provide the icon used for the fillets feature in the icon to feature map, would provide the pop-up menu used for the fillets feature in the feature type to graphical browser pop-up map, et cetera.

Following the step 244 is a test step 246 which determines if the last feature has been accessed to initialize the mapping data 230. If not, then control transfers from the step 246 back to the step 242 to access another feature to initialize the mapping data 230. If, on the other hand, it is determined at the step 246 that the looping variable is equal to the last and final feature from the feature data 208, then the entirety of the mapping data 230 has been initialized and control transfers from the step 246 to a step 248 where the visual tree control module 228 and tree data is initialized. The specific method of initializing the visual tree control module 228 is explained in instruction manuals which are provided by Microsoft Corporation with the visual tree control module software. Initializing the actual tree shown on the screen involves accessing the feature data 208 to determine order of creation, dependencies, etc. for each of the features, and then making appropriate calls to the visual tree control module 228, passing on feature names, icons (from the mapping data 230), connections, etc.

Following the step 248 is a step 250 where a window event initiated by the user is processed. Essentially, the remainder of operation of the graphical browser 204 consists of processing user events at the step 250. A detailed discussion of the step 250 is provided below. Following the step 250 is a test step 252 which determines if the event provided by the user is an exit event, i.e., if the user has indicated a desire to exit the graphical browser program 204 (and, by inference, exit the modeling program). If not, then control transfers from the test step 252 back to the step 250 to process the next event entered by the user. Otherwise, if it is determined at the test step 252 that the user has exited the program, then processing for the graphical browser 204 is complete.

Figure 23:
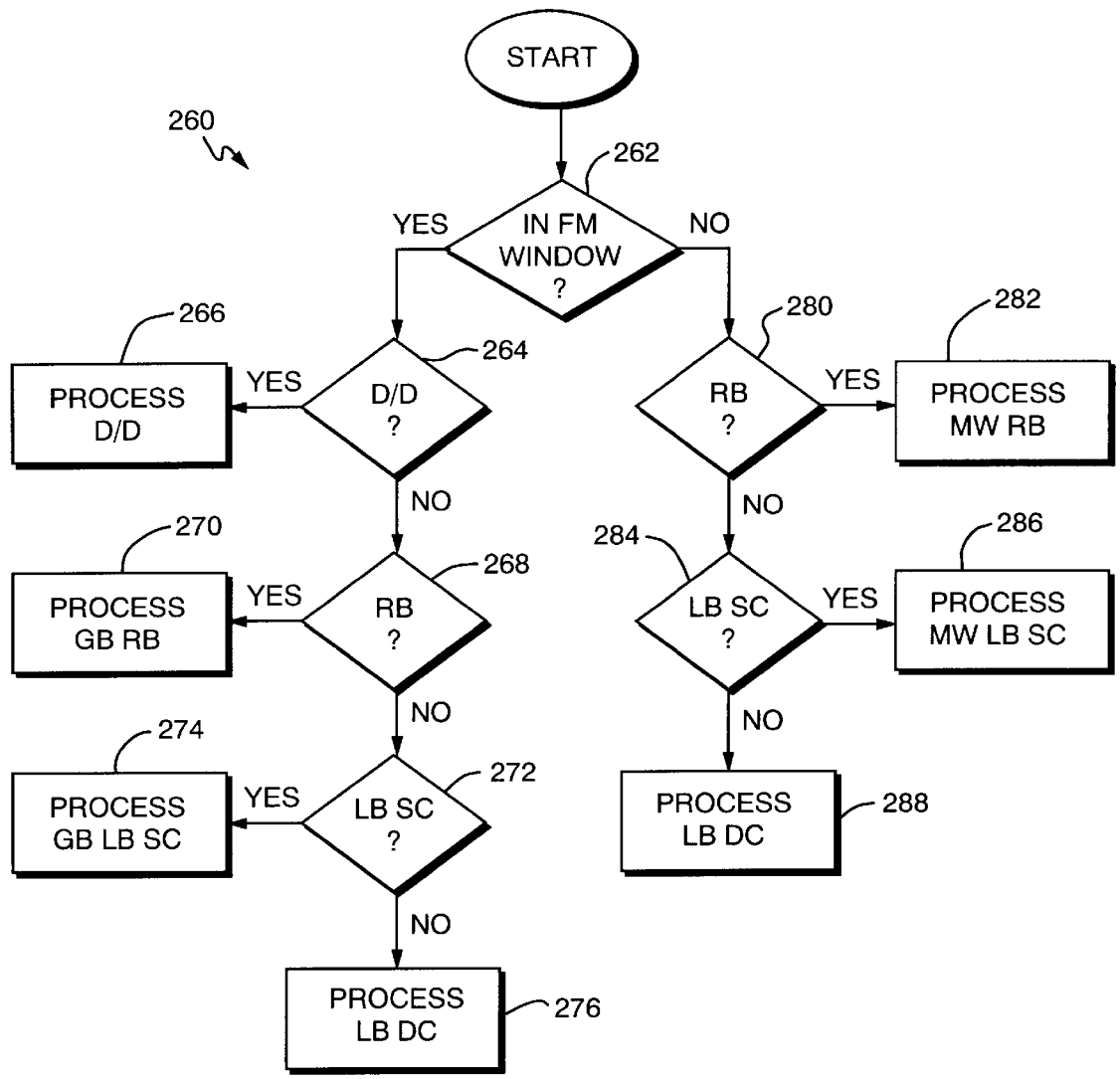
FIG. 23 is a flow chart showing event handling for the graphical browser.

Referring to FIG. 23, a flow chart 260 illustrates the process events step 250 shown in the flow chart 240 of FIG. 22. An event is user initiated and occurs when the user takes an action to interact with the modeling program. Events are initially handled by the operating system (Microsoft Windows) which passes on the events to the modeling program. Appropriate events that are passed on to the graphical browser 204 include mouse clicking events that cause the graphical browser to take specific action.

For the flow chart 260, processing begins at the test step 262 to determine if the mouse clicking event occurred while the mouse cursor was in the graphical browser portion of the window or the modeling portion of the window. If the mouse was clicked while the cursor was in the graphical browser portion, then control transfers from the test step 262 to a test step 264 to determine if the mouse clicking event is in conjunction with a drag and drop (D/D) operation. Note that the determination if the mouse click is in the graphical browser window or the modeling portion of the window, and the determination if the mouse click is performed in conjunction with a drag and drop operation are both performed by the operating system and/or the tree control module 228. The graphical browser 204 simply receives data indicative of this information. Note also that, as discussed above, the cut and paste operation is similar to the drag and drop operation. Accordingly, the discussion of dragging and dropping which follows can also apply to cutting and pasting.

If it is determined at the test step 264 that the data being provided is a mouse click performed in conjunction with a drag and drop operation, then control transfers from the test step 264 to a step 266 where the drag and drop operation is processed. Processing the drag and drop operation at the step 266 is described in more detail hereinafter.

If it is determined at the step 264 that the mouse click is not being provided in connection with a drag and drop operation, then control transfers from the test step 264 to a test step 268 to determine if the right button of the mouse is being clicked. If so, then control transfers from the test step 268 to a step 270 which processes the right button click of the mouse while the cursor of the mouse is in the graphical browser portion of the window. The processing step 270 is described in more detail hereinafter.

If it is determined at the test step 268 that the right button of the mouse has not been clicked, then control transfers from the test step 268 to a test step 272 to determine if the left button of the mouse has been single clicked. Note that, as discussed above in connection with FIGS. 1–20, single clicking the left button of the mouse performs a different operation than double clicking the left button of the mouse. If it is determined at the test step 272 that the left button of the mouse has been single clicked, then control transfers from the test step 272 to the step 274 to process the left button single click of the mouse. The processing at the step 274 is described in more detail hereinafter.

If it is determined at the test step 272 that the left button of the mouse has not been single clicked, then control transfers from the test step 272 to a step 276 which processes the double click of the left button of the mouse in the graphical browser. Accordingly, the step 276 is reached when the user double clicks the left button of the mouse while the cursor of the mouse is in the graphical browser. Note that the flow chart 260 does not take into account events which occur that are not processed by the graphical browser 204. However, one of ordinary skill in the art can appreciate that irrelevant events are simply not processed by the graphical browser 204. Processing the double click of the left button of the mouse while the cursor of the mouse is in the graphical browser is performed at the step 276, which is described in more detail hereinafter.

If it is determined at the step 262 that the mouse button has not been clicked while the cursor of the mouse is in the graphical browser portion of the window, then presumably the mouse has been clicked while the cursor was in the modeling portion of the window control transfers from the step 262 to a test step 280 to determine if the right button of the mouse has been clicked. If so, then control transfers from the test step 280 to a step 282 to process the clicking of the right button of the mouse while the cursor of the mouse is in the modeling portion of the window. The step 282 is described in more detail hereinafter.

If it is determined at the step 280 that the user has not pressed the right button of the mouse, then control transfers from the step 280 to a test step 284 to determine if the user has single clicked the left button of the mouse. If so, then control transfers from the step 284 to a step 286 to process the left button single click of the mouse. Processing the left button single click of the mouse at the step 286 is described in more detail hereinafter.

If it is determined at the step 284 that the user has not single clicked the left button of the mouse, then control transfers from the step 284 to a step 288 to process the double click of the left button of the mouse while the cursor of the mouse is in the modeling portion of the window. Processing at the step 288 is identical to processing at the step 276 and is described in more detail hereinafter.

Figure 24:
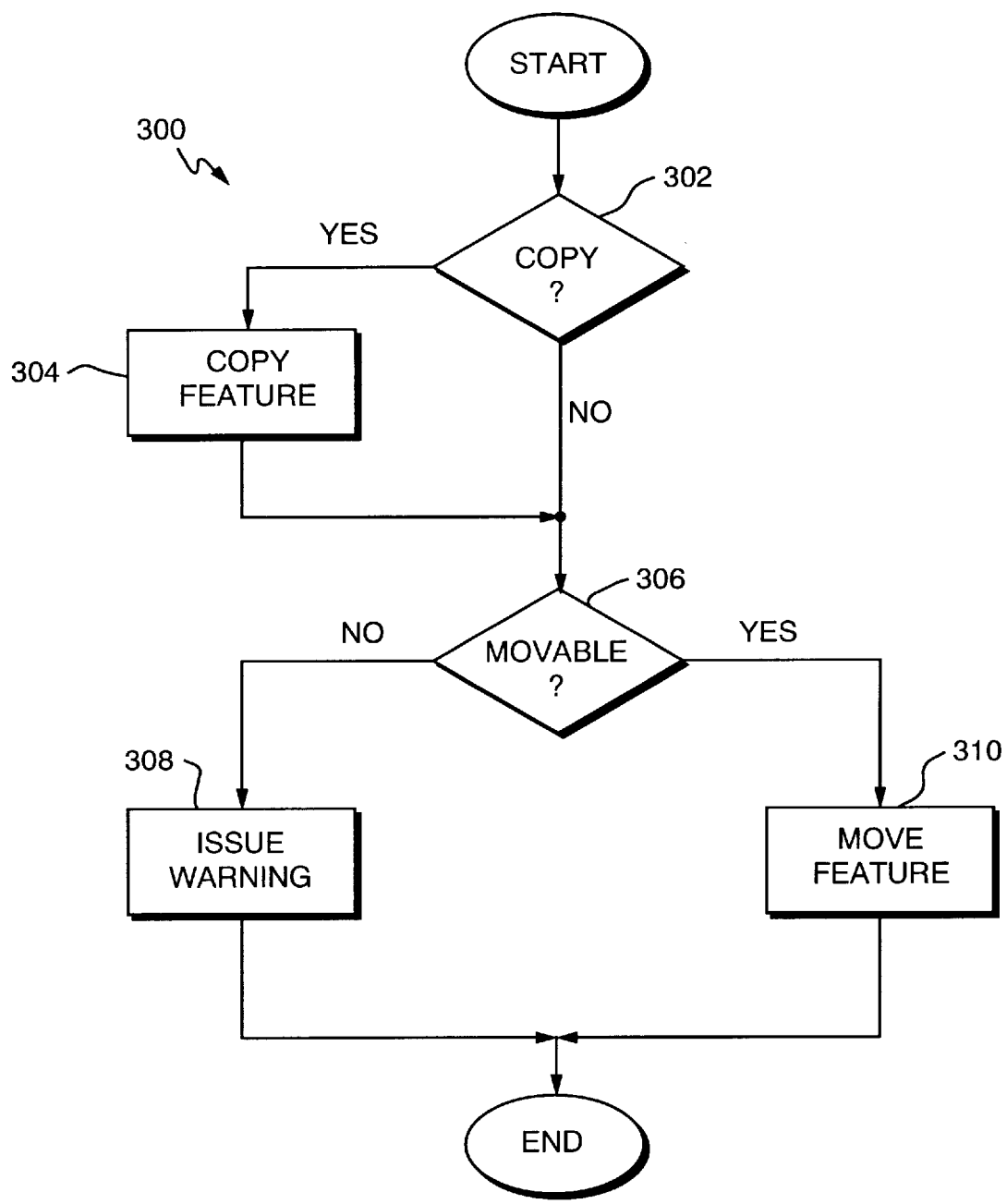
FIG. 24 is a flow chart showing the drag and drop operation of the graphical browser.

Referring to FIG. 24, a flow chart 300 illustrates in detail operation of the drag and drop step 266 of FIG. 23. At a first test step 302, it is determined if the user is copying the feature being dragged and dropped or if the user is moving the feature. When a feature is copied in the drag and drop procedure, the feature remains in its original location in the feature list while a copy of the feature is moved to a new location indicated by the user. If a feature is not copied during the drag and drop operation, then the selected feature is detached from the original location in the feature list and placed in a new location indicated by the user. Note also that the tree control module 228 shown in FIG. 21 handles most of the operations for the drag and drop including moving the icons, copying the icons, providing data indicative of the icons being dragged and dropped to the graphical browser 204, and handling most of the details of dialog boxes, et cetera. Essentially, most of the drag and drop operation is performed by the virtual tree control module 228.

If it is determined at the test step 302 that the user is copying the feature that is being dragged and dropped, then control transfers from the step 302 to a step 304 where the feature is copied. The user interface portion of copying the feature is performed by the virtual tree control module 228 code section that handles the drag and drop. The graphical browser software 204 simply receives an indication from the virtual tree control module 228 that the feature selected by the user is in fact being copied rather than moved from its original location. The graphical browser 204 copies the feature in the feature data 208.

A test step 306 follows either the step 304 or the step 302. At the test step 306, it is determined if the feature selected by the user is movable. Whether a feature is movable is a function of the modeling program used in conjunction with the graphical browser 204, but often entails a determination if a selected feature is being moved ahead of features on which the selected feature depends. For example, if an extrusion is constructed using a sketch, then the sketch cannot be moved ahead of the extrusion since then the extrusion would then become undefined. The extrusion feature depends on the sketch feature and hence the sketch feature must come before the extrusion feature. Note that this is not the case if the sketch feature is copied rather than simply moved.

The movability determination at the step 306 can be made in a variety of manners, including making a call in to the modeling program which returns a Boolean variable indicating that a particular feature is movable to a particular location or not. It is also possible for the modeling program to maintain information in the feature data 208 indicating which ones of the features can be moved ahead of which other ones of the features. Alternatively, for a relatively unsophisticated modeling program, it is possible to simply return "true" or "yes" each time the test is made at the step 306, thus rendering permissible all drag and drop operations performed by the user. Of course, in this instance, performing a drag and drop that leaves features undefined could have undesirable effects on the model. However, handling the test at the step 306 this way is one of many design choices available.

If it is determined at the test step 306 that the feature being dragged and dropped is not movable, then control transfers from the step 306 to a step 308 where the user is issued a warning in the form of a dialog box indicating that the desired drag and drop operation is impermissible. Following the step 308, processing for the drag and drop operation is complete.

If it is determined at the step 306 that the feature is movable, control transfers from the step 306 to a step 310 where the feature is moved. Moving the feature involves sending a signal to the virtual tree control module 228 indicating that the operation provided by the user is acceptable and so the feature list on the graphical browser should be modified. In addition, the graphical browser 204 modifies information in the feature data 208 in order to indicate the changed ordering of the features. At this stage, it may be necessary for the modeling program interface 206 to activate the rebuild engine 212 to regenerate the geometry data 210 in order to reflect the changes to the model. Alternatively, it is possible to simply make the changes to the feature data 208 without activating the rebuild engine 212. Following the step 310, processing is complete.

Figure 25:
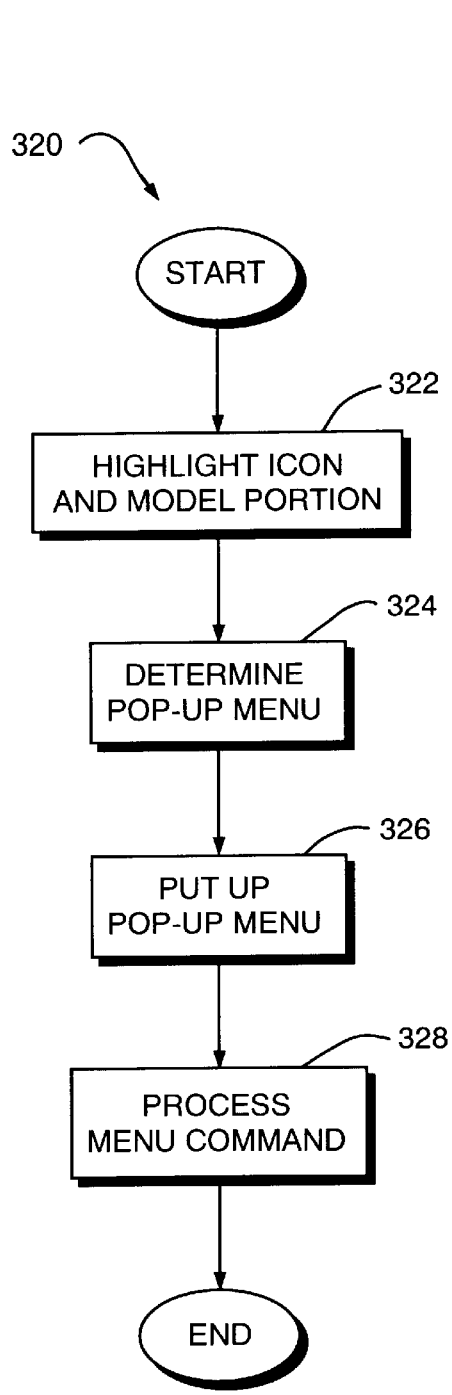
FIG. 25 is a flow chart showing processing when a user clicks the right mouse button while the mouse cursor is in the graphical browser portion of the window.

Referring to FIG. 25, a flow chart 320 illustrates in detail operations performed at the step 270 of FIG. 23 where the user clicks the right button of the mouse while the cursor of the mouse is in the graphical browser portion of the window. At a first step 322, the icon that is coincident with the cursor of the mouse is highlighted as is the portion of the model in the modeling portion of the window corresponding to the feature associated with the icon. Highlighting the icon and the model portion at the step 322 is described in more detail hereinafter.

Following step 322 is a step 324 which determines which pop-up menu to present to the user. The determination is made at the step 324 by examining the feature type to graphical browser pop-up menu map contained in the mapping data 230 and discussed above. Following the step 324 is a step 326 where the appropriate pop-up menu is presented to the user using library calls for that purpose provided with the Windows operating system and/or with the virtual tree control module 228. Following the step 326 is a step 328 where the menu commands are processed.

Examples of different menu options are given throughout the discussion of FIGS. 1–20. The decision to implement specific menu options for specific features is a design choice based on a variety of functional factors familiar to one of ordinary skill in the art. The menu options can perform conventional modeling program operations. Accordingly, use of the right mouse button within the graphical browser 204 is simply a mechanism for providing context-sensitive options to the user in a convenient fashion wherein the options are also accessible by other conventional modeling means that may be less convenient.

Figure 26:
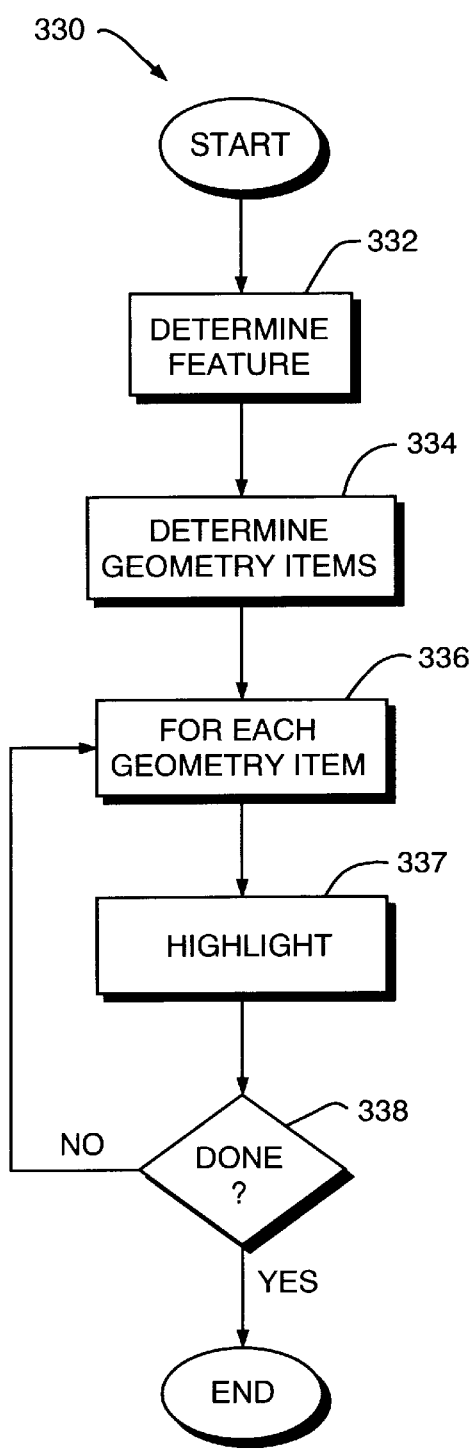
FIG. 26 is a flow chart showing processing when a user single clicks the left mouse button while the mouse cursor is in the graphical browser portion of the window.

Referring to FIG. 26, a flow chart 330 illustrates in more detail the processing associated with processing a single click of the left mouse button while the cursor of the mouse button is in the graphical browser as shown in the step 274 of FIG. 23. At a first step 332, a determination is made as to which feature from the feature data 208 corresponds to the icon of the graphical browser list that was coincident with the cursor when the user pressed the left button of the mouse. This is done by accessing the icon to feature map found in the mapping data 230. Following determination of the specific feature at the step 332 is a step 334 where the geometric data items associated with the specific feature are also determined. Note that any feature of the feature data 208 could have any number (including zero) of geometric data items associated therewith. The correlation of the feature from the feature data 208 and the geometric data items from the geometric data 210 is provided by accessing the connections data 214, discussed above, which correlates feature data 208 with geometric data 210.

Following the step 334 is a loop step 336 where a loop variable is set equal to each geometric item determined at the step 334. Following the step 336 is a step 337 where each geometric item is highlighted. The geometric items can be highlighted using any one of a number of conventional mechanisms, including displaying the highlighted geometric items in a different color than non-highlighted geometric items. Highlighting the geometric items changes the display of the modeling portion of the window. Following the step 337 is a step 338 which tests if all of the geometric items determined at the step 334 have been highlighted. If not, control transfers back up to the looping step 336 in order to loop on the next geometric item. Otherwise, if it is determined at the step 338 that all the geometric items have been highlighted, then processing is complete following the step 338. Note that the steps of the flow chart 330 can be used for highlighting at the step 322 of FIG. 25.

Figure 27:
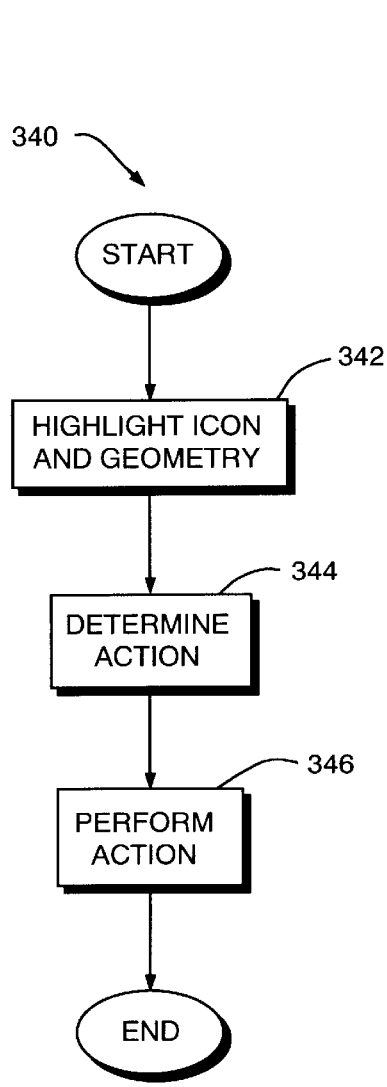
FIG. 27 is a flow chart showing processing when a user double clicks the left mouse button.

Referring to FIG. 27, a flow chart 340 illustrates in detail processing the double click of the left mouse button of the steps 276, 288 of FIG. 23. At a first step 342 the feature icon and associated geometry are highlighted in a manner similar to that described for the steps of FIG. 26. Following the step 342 is a step 344 where the action associated with double clicking the left button is determined by accessing the mapping data 230 of the graphical browser 204 to find the appropriate feature type to action correlation in order to determine which action is appropriate. Following the step 344 is a step 346 where the action is performed.

The action that is performed at the step 346 depends on the type of feature and is a design choice based on a variety of functional factors familiar to one of skill in the art. For example, it is possible for the left button double click to show dimensions of the feature, as illustrated in connection with FIG. 5 and described above. It is also possible for the system to be designed such that double clicking the left button puts the selected feature in a modifiable state.

Figure 28:
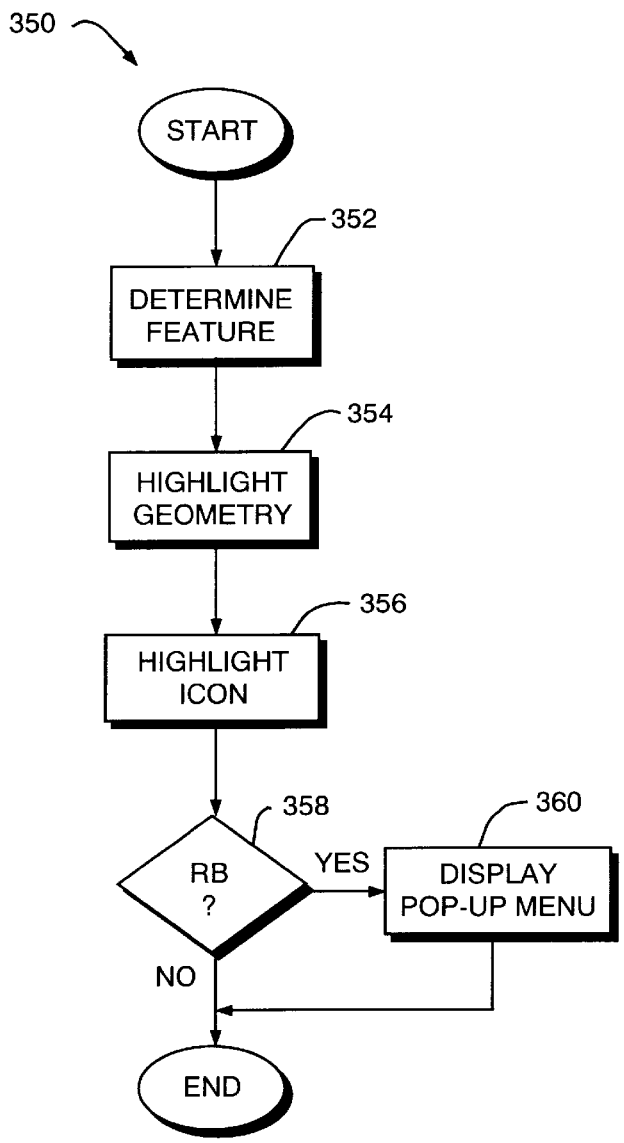
FIG. 28 is a flow chart showing processing when a user clicks the right mouse button while the cursor is in the modeling portion of the window.

Referring to FIG. 28, a flow chart 350 corresponds to the steps 282, 286 of FIG. 23 which occur, respectively, when the right button is pressed with the mouse in the modeling portion of the window and when the left button of the mouse is single clicked with the cursor of the mouse being in the modeling portion of the window. Processing begins at a first step 352 to determine the feature corresponding to the specific geometry selected by clicking the mouse button with the cursor coincident with the modeling portion. The feature is determined by accessing the connections data 214 of the model program interface 206. Given a particular geometric feature found in the geometric data 210, the connections data 214 can determine which feature or features correspond to the specific geometric data item selected by the user.

Following the step 352 is a step 354 where the geometry data items selected by clicking the mouse button are highlighted. The details and options for highlighting geometry is discussed above in connection with FIG. 26.

Following the step 352 is a step 356 where the icon(s) associated with the feature or features that correspond to the selected geometry are highlighted. That is, when the user clicks a mouse button on a portion of the model, not only is that portion of the model highlighted but so is the icon or icons corresponding to the feature or features determined at the step 352. Following the step 356 is a test step 358 which determines if the right button (as opposed to the left button) of the mouse has been clicked. If so, then control transfers from the step 358 to a step 360 where a pop-up menu is displayed. The pop-up menu associated with the specific feature is found in the mapping data 230, as described above. If, on the other hand, it is determined at the step 358 that the right button has not been pressed (and hence by inference the left button of the mouse has been pressed), then no pop-up menu is displayed. Following the step 360 or following the step 358 if the left button of the mouse is pressed, processing is complete.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A graphical browser, for displaying and manipulating a computer model generated by a computer aided design system, comprising:
    data accessing means, for accessing data indicative of features of the model and data indicative of geometric characteristics of the model, wherein the data indicative of features of the model corresponds to operations for constructing the model using computer-aided design software;
    model display means, coupled to said data accessing means, for displaying at least one image indicative of the geometric characteristics of the model;
    feature presentation means, coupled to said data accessing means, for presenting a graphical image indicative of features of the model; and
    feature manipulation means, coupled to said data accessing means and said feature presentation means, for allowing a user to graphically manipulate portions of said graphical image indicative of features of the model to provide corresponding changes to the data indicative of features of the model and to the data indicative of geometric characteristics of the model.

2. A graphical browser, according to claim 1, wherein said data accessing means includes an interface to feature data and geometric data of the model.

3. A graphical browser, according to claim 1, wherein said feature presentation means includes means for presenting different icons indicative of different types of features of the model.

4. A graphical browser, according to claim 3, wherein said feature presentation means further includes ordering and connecting the icons to indicate an order of creation of features of the model.

5. A graphical browser, according to claim 4, wherein said feature presentation means further includes means for indicating interdependency of features.

6. A graphical browser, according to claim 5, wherein said data accessing means includes an interface to feature data and geometric data of the model.

7. A graphical browser, according to claim 6, wherein said feature manipulation means includes means for altering the ordering of the features of the model.

8. A graphical browser, according to claim 7, wherein altering the ordering of the features of the model includes dragging and dropping graphical representations of features of the model.

9. A graphical browser, according to claim 7, wherein altering the ordering of the features of the model includes cutting and pasting graphical representations of features of the model.

10. A graphical browser, according to claim 4, wherein said feature manipulation means includes means for altering the ordering of the features of the model.

11. A graphical browser, according to claim 10, wherein altering the ordering of the features of the model includes dragging and dropping graphical representations of features of the model.

12. A graphical browser, according to claim 10, wherein altering the ordering of the features of the model includes cutting and pasting graphical representations of features of the model.

13. A graphical browser, according to claim 1, wherein said feature manipulation means includes means for altering the ordering of the features of the model.

14. A graphical browser, according to claim 13, wherein altering the ordering of the features of the model includes dragging and dropping graphical representations of features of the model.

15. A graphical browser, according to claim 13, wherein altering the ordering of the features of the model includes cutting and pasting graphical representations of features of the model.

16. A graphical browser, according to claim 1, wherein said data manipulation means includes means for selectively suppressing certain ones of the features.

17. A graphical browser, according to claim 1, wherein said feature presentation means includes means for presenting various alignment features of the model.

18. A graphical browser, according to claim 1, wherein said data manipulation means further includes means for rolling back the model to a particular feature, so that said particular feature, and subsequent features, are suppressed.

19. A graphical browser, according to claim 18, wherein said data manipulation means further comprises:

means for stepping through each feature of the model, one at a time, to unsuppress each feature on the model, one at a time.

20. A computer-aided design system, for displaying and manipulating a computer model generated by a computer aided design system, comprising:

model presentation means, for presenting, in a modeling portion of a computer screen, a first graphical image indicative of geometric data of the model corresponding to geometric characteristics thereof;

feature presentation means, for presenting, in a graphical browser portion of the computer screen, a second graphical image indicative of feature data of the model corresponding to operations for constructing using computer-aided design software;

first highlighting means, for highlighting a subset of the first graphical image in response to a user selecting a corresponding subset of the second graphical image; and second highlighting means, for highlighting a subset of the second graphical image in response to the user selecting a corresponding subset of the first graphical image.

21. A graphical browser, according to claim 20, wherein said feature presentation means includes means for presenting different icons indicative of different types of features of the model.

22. A graphical browser, according to claim 21, wherein said feature presentation means further includes ordering and connecting the icons to indicate an order of creation of features of the model.

23. A graphical browser, according to claim 22, wherein said feature presentation means further includes means for indicating interdependency of features.

24. A graphical browser, according to claim 23, wherein said feature presentation means includes means for presenting various alignment features of the model.

25. A graphical browser, according to claim 20, wherein said feature presentation means includes means for presenting various alignment features of the model.

26. A method of displaying and manipulating a computer model generated by a computer aided design system, comprising the steps of:

accessing data indicative of features of the model and data indicative of geometric characteristics of the model, wherein the data indicative of features of the model corresponds to operations for constructing the model using computer-aided design software;

displaying at least one image indicative of the geometric characteristics of the model;

presenting a graphical image indicative of features of the model; and allowing a user to graphically manipulate the graphical image indicative of the features of the model to cause corresponding changes to the data indicative of features and to the data indicative of geometric characteristics of the model.

27. A method of displaying and manipulating a computer model, according to claim 26, further comprising the step of:

presenting different icons indicative of different types of features of the model.

28. A method of displaying and manipulating a computer model, according to claim 27, further comprising the step of:

ordering and connecting the icons to indicate an order of creation of features of the model.

29. A method of displaying and manipulating a computer model, according to claim 28, further comprising the step of:

indicating interdependency of features.

30. A method of displaying and manipulating a computer model, according to claim 29, further comprising the step of:

interfacing to feature data and geometric data of the model.

31. A method of displaying and manipulating a computer model, according to claim 26, wherein the step of allowing the user to graphically manipulate the graphical data includes allowing the user to alter the ordering of the features of the model.

32. A method of displaying and manipulating a computer model, according to claim 31, wherein altering the ordering of the features of the model includes dragging and dropping graphical representations of features of the model.

33. A method of displaying and manipulating a computer model, according to claim 31, wherein altering the ordering of the features of the model includes cutting and pasting graphical representations of features of the model.

34. A method of displaying and manipulating a computer model, according to claim 26, wherein the step of allowing the user to graphically manipulate the graphical data includes selectively suppressing certain ones of the features.

35. A method of displaying and manipulating a computer model, according to claim 26, wherein the step of allowing the user to graphically manipulate the graphical data includes presenting various alignment features of the model.

36. A method of displaying and manipulating a computer model, according to claim 26, wherein the step of allowing the user to graphically manipulate the graphical data includes rolling back the model to a particular feature, so that said particular feature, and subsequent features, are suppressed.

37. A method of displaying and manipulating a computer model, according to claim 36, wherein the step of allowing the user to graphically manipulate the graphical data includes stepping through each feature of the model, one at a time, to unsuppress each feature on the model, one at a time.

38. A method for displaying and manipulating a computer model generated by a computer aided design system, comprising the steps of:

presenting, in a modeling portion of a computer screen, a first graphical image indicative of geometric data of the model corresponding to geometric characteristics thereof;

presenting, in a graphical browser portion of the computer screen, a second graphical image indicative of feature data of the model corresponding to operations for constructing the model using computer-aided design software;

highlighting a subset of the first graphical image in response to a user selecting a corresponding subset of the second graphical image; and highlighting a subset of the second graphical image in response to the user selecting a corresponding subset of the first graphical image.

39. A method for displaying and manipulating a computer model, according to claim 38, further comprising the step of:

presenting different icons indicative of different types of features of the model.

40. A method for displaying and manipulating a computer model, according to claim 39, further comprising the step of:

ordering and connecting the icons to indicate an order of creation of features of the model.

41. A method for displaying and manipulating a computer model, according to claim 40, further comprising the step of:

indicating interdependency of features.

42. A method for displaying and manipulating a computer model, according to claim 41, further comprising the step of:

presenting various alignment features of the model.

43. A method for displaying and manipulating a computer model, according to claim 38, further comprising the step of:

presenting various alignment features of the model.

* * * * *